(12) United States Patent
Zhang et al.

(10) Patent No.: US 6,805,817 B2
(45) Date of Patent: Oct. 19, 2004

(54) MOLECULAR DEVICES ACTIVATED BY AN ELECTRIC FIELD FOR ELECTRONIC INK AND OTHER VISUAL DISPLAY

(75) Inventors: Xiao-An Zhang, Sunnyvale, CA (US); Alexandre Bratkovski, Mountain View, CA (US); Yong Chen, Palo Alto, CA (US); R. Stanley Williams, Redwood City, CA (US); Kent D. Vincent, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 425 days.

(21) Appl. No.: 09/932,186

(22) Filed: Aug. 17, 2001

(65) Prior Publication Data

US 2002/0075420 A1 Jun. 20, 2002

Related U.S. Application Data

(63) Continuation-in-part of application No. 09/844,862, filed on Apr. 27, 2001, which is a continuation-in-part of application No. 09/823,195, filed on Mar. 29, 2001, which is a continuation-in-part of application No. 09/759,438, filed on Jan. 12, 2001, now Pat. No. 6,512,119, which is a continuation-in-part of application No. 09/738,793, filed on Dec. 14, 2000, now Pat. No. 6,663,797.

(51) Int. Cl.[7] .......................... H01B 1/12; C09K 19/02; G02B 5/22; G02F 6/24
(52) U.S. Cl. .................. 252/589; 252/519.3; 252/510; 252/299.61; 252/299.62; 252/301.16; 428/690; 385/2; 385/8; 385/17
(58) Field of Search ..................... 252/301.16, 500, 252/511, 510, 519.3, 589, 299.61, 299.62, 301.17; 428/690, 917; 257/40, 103; 385/2, 8, 17, 39

(56) References Cited

U.S. PATENT DOCUMENTS 5,982,346 A    11/1999    Sheridon et al. .............. 345/85

(List continued on next page.)

FOREIGN PATENT DOCUMENTS

WO    WO 02088837    11/2002

OTHER PUBLICATIONS

U.S. patent application Ser. No. 09/844,862, filed Apr. 27, 2001, entitled "Molecular Mechanical Devices With A Band Gap Change Activated By An Electric Field For Optical Switching Applications".

(List continued on next page.)

Primary Examiner—Mark Kopec
Assistant Examiner—Kallambella Vijayakumar

(57) ABSTRACT

An electric field activated molecular system, preferably bi-stable, configured within an electric field generated by a pair of electrodes is provided for use, e.g., as electronic ink or other visual displays. The molecular system has an electric field induced band gap change that occurs via a change (reversible or irreversible) of the extent of the electron conjugation via chemical bonding change to change the band gap, wherein in a first state, there is substantial conjugation throughout the molecular system, resulting in a relatively smaller band gap, and wherein in a second state, the substantial conjugation is destroyed, resulting in a relatively larger band gap. The changing of substantial conjugation may be accomplished in one of the following ways: (1) charge separation or recombination accompanied by increasing or decreasing electron localization in the molecule; or (2) change of substantial conjugation via charge separation or recombination and $\pi$-bond breaking or making. A primary advantage of the molecular system is improved contrast. Because the colorant of the present invention is molecular and thus effectively monoplanar, there should be no backside reflection or excessive scattering from the colorant. A second advantage of the present invention is improved resolution. Finally, each molecule of the present invention will latch to stabilize one or the other of its color states.

30 Claims, 4 Drawing Sheets

U.S. PATENT DOCUMENTS

| | | | | |
|---|---|---|---|---|
| 6,017,584 | A | 1/2000 | Albert et al. | 427/213.3 |
| 6,067,185 | A | 5/2000 | Albert et al. | 359/296 |
| 6,128,214 | A | 10/2000 | Kuekes et al. | 365/151 |
| 6,579,630 | B2 * | 6/2003 | Li et al. | 428/690 |
| 2002/0009274 | A1 * | 1/2002 | Gharavi | 385/122 |

OTHER PUBLICATIONS

U.S. patent application Ser. No. 09/823,195, filed Mar. 29, 2001, entitled "Bistable Molecular Mechanical Devices With A Band Gap Change Activated By An Electric Field For Electronic Switching, gating, And Memory Applications".

U.S. patent application Ser. No. 09/759,438, filed Jan. 12, 2001, entitled "Bistable Molecular Mechanical Devices With An Appended Rotor Activated By An Electric Field For Electric Switching, Gating and Memory Applications".

U.S. patent application Ser. No. 09/738,793, entitled "Stabilization Of Configurable Molecular Mechanical Devices" filed Dec. 14, 2000.

U.S. patent application Ser. No. 09/898,799, entitled "Bistable Molecular Mechanical Devices Activated By An Electric Field For Electronic Ink And Other Visual Display Applications", filed on Jul. 3, 2001.

U.S. patent application Ser. No. 09/919,394, entitled "Field Addressable Rewritable Media", filed on Jul. 31, 2001.

Kawai S H et al.: "A duel–mode optical–electrical molecular switching device" Journal of the Chemical Society, Chemical Communications, Chemical Society, Letchworth GB No. 8 1994, pp. 1011–1013 XP002165573.

Suzuki T et al: "A new type of Tricolor electrochromic system" Chemical Communications, Royal Society of Chemistry, GB 1998 pp. 2193–2194 XP002246486.

Nishida J et al: "A Redox Switch based on" Angew. Chem. Int. Ed; Angewandta Chemie–international vol. 40, No. 17, Sep. 3, 2001 pp. 3251–3254 XP00224684.

Hunig S et al: "Violence/Cyanine Hybrids as Electrochromic Systems, Part 3: Heterocyclic Onium End Groups" Tetrahedron, Elsevier Science Publishers Amsterdam, NL vol. 56, No. 25, Jun. 2000 pp. 4203–4211, XP004201672.

Zheng H B et al: "Electrochemical and electrochromic properties of poly (ether naphthalimide)s and related model compounds" Plymer, Elsevier Science Publishers 8.V, GB vol. 42, No. 8, Apr. 2001 pp. 3745–3750 XP004313917.

Suzuki T & A: "Preparation, Structure and Redox Reactions of" Angewante Chemie (International Edition) 1998, Wiley–VCH, Germany vol. 39, No. 1, pp. 1804–1806 XP00246485.

Zelikovich et al: "Molecular Redox Switches based on Chemical Triggering of Iron . . . " Nature, Macmillan Journals LTD. London, GB, vol. 374, Apr. 27, 1995 pp. 790–792 XP002246597.

* cited by examiner

MOLECULAR DEVICES ACTIVATED BY AN ELECTRIC FIELD FOR ELECTRONIC INK AND OTHER VISUAL DISPLAY

CROSS-REFERENCE TO RELATED APPLICATIONS

The present application is a continuation-in-part application of Ser. No. 09/844,862, filed Apr. 27, 2001, which in turn is a continuation-in-part application of Ser. No. 09/823,195, filed Mar. 29, 2001, which in turn is a continuation-in-part application of Ser. No. 09/759,438, filed Jan. 12, 2001, now U.S. Pat. No. 6,512,119, issued Jan 28, 2003, which in turn is a continuation-in-part application of Ser. No. 09/738,793, filed Dec. 14, 2000, now U.S. Pat. No. 6,663,797, issued Dec. 13, 2003.

The present application is related to application Ser. No. 09/898,799, filed Jul. 3, 2001. That application is directed to a specific molecular system for electronic inks and other visual media, wherein the molecular system involves at least one rotatable segment (rotor or rotors) that has a large dipole moment and that links with at least one other portion of the molecule that is immobilized (stator or stators).

The present application is directed to a specific molecular system that involves electric-field-induced bond breaking and charge separation. The molecular system disclosed herein provides switching from one state to a different state, characterized by a change in the optical properties, including color, of the molecules. In the case of color switching, the present invention turns ink or dye molecules into active opto-electronic devices that can be switched by an external electric field for electronic ink and other visual display applications.

TECHNICAL FIELD

The present invention relates generally to visual display applications, such as electronic ink, and, more particularly, to a molecular system that provides optical switching. Optical devices with micrometer or sub-micrometer critical dimensions may be constructed in accordance with the teachings herein.

BACKGROUND ART

Flexible displays made with a technology known as electronic ink, or E ink, are in the process of commercial development. While the early versions are expected to resemble simple displays that might sit by the side of a highway to warn of trouble ahead or might advertise specials at a convenience store, later versions are expected to lead to electronic books with paper-like pages and illustrations that move, newspapers that update themselves, reusable paper displays for cellular phones, disposable TV screens, and even electronic wallpaper.

There are two presently-known competing technologies: E Ink's electrophoretic displays and Xerox's gyricon spheres.

The electrophoretic displays are disclosed, for example, in U.S. Pat. No. 6,017,584, issued Jan. 25, 2000, and entitled "Multi-Color Electrophorectic Displays and Materials for Making the Same", and in U.S. Pat. No. 6,067,185, issued May 23, 2000, and entitled "Process for Creating an Encapsulated Electrophoretic Display".

Generally, an encapsulated electrophoretic display includes one or more species of particles that either absorb or scatter light. One example is a system in which the capsules contain one or more species of electrophoretically mobile particles dispersed in a dyed suspending medium. Another example is a system in which the capsules contain two separate species of particles suspended in a clear suspending fluid, in which one of the species of particles absorbs light (black), while the other species of particles scatters light (white). Other extensions are possible, including more than two species of particles, with or without a dye, etc. The particles are commonly solid pigments, dyed particles, or pigment/polymer composites.

The gyricon spheres are disclosed in a number of patents issued and assigned on their face to Xerox Corporation; an example of one such patent is U.S. Pat. No. 5,892,346, issued Nov. 9, 1999, and entitled "Fabrication of a Twisting Ball Display Having Two or More Different Kinds of Balls".

The gyricon, also called the twisting-ball display, rotary ball display, particle display, dipolar particle light valve, etc., offers a technology for making a form of electric paper. Briefly, a gyricon is an addressable display made up of a multiplicity of optically anisotropic balls, each of which can be selectively rotated to present a desired face to an observer. Thus, in one version at least, the gyricon is a solid microsphere, hemispherically-colored black and white and having hemispherically-opposing zeta potentials. Each gyricon rotates within a dielectric oil-filled microcavity formed in the media upon exposure to an externally-applied electric field.

The primary disadvantage of both electrophoretic ink and the gyricon is poor contrast. Hemispherically-colored microspheres, or microcapsules, being fully three dimensional, have backside reflection and scattering that reduce the contrast of dark and white images reflected toward the observer.

The second disadvantage of both the electrophoretic ink and the gyricon solutions is limited image resolution. Both solutions are limited to practical microcapsule or microsphere diameters on the order of 20 to 40 micrometers. Electrophoretic ink microcapsules are limited by the need to microencapsulate sufficient pigmented colorant to provide reasonable color contrast and opacity within each microcapsule. Gyricon spheres are limited by thermal mass requirements to form microspheres from coalesced colored droplets in water. Microsphere diameters on the order of 5 to 10 micrometers are desired and common to toner colorant used in laser printers.

Each prior solution must use a low dielectric liquid (oil), rather than water. Since water is an excellent solvent for ionic species, water solutions are conductive and would collapse the electric field that otherwise allows electrophoretic movement of the colorants. The colorant switching time and voltage is dependent on oil viscosity, which is negatively impacted by lowered ambient temperature.

Finally, the prior art colorants have poor mechanical durability by virtue of their microcapsule composition. Microcapsule fabrication processes generally produce micron thin capsule walls, typically 10% of the capsule diameter, which are easily broken. This factor is why microcapsules are typically used to deliver encapulsated fluids upon application of external pressure or solvation (e.g., carbonless paper). The fragile nature of microcapsules makes them poorly suited for electronic paper applications where folding and surface contact is common.

Thus, what is needed is a molecular system that exhibits image contrast and mechanical durability commensurate with ink on paper, avoids chemical oxidation and/or reduction, permits reasonably rapid switching from a first state to a second state, is reversible to permit real-time or video rate display applications, and can be used in a variety of optical display applications, such as e-ink.

DISCLOSURE OF INVENTION

In accordance with the present invention, a switchable medium for a visual display comprising an electric field activated bi-stable or e-field dependent molecular system configured within an electric field generated by a pair of electrodes is provided. The molecular system has an electric field induced band gap change that occurs via a change (reversible or irreversible) of the extent of the conjugation in a molecule via chemical bonding change, which results in the change of the band gap. That is to say, the molecular system can undergo a bond breaking or making in the presence of an applied electric field, thereby inducing a band gap change in the molecular system, wherein in a first state, there is substantial conjugation throughout the molecular system, resulting in a relatively smaller band gap, and wherein in a second state, the substantial conjugation is destroyed, resulting in a relatively larger band gap. The changing of substantial conjugation may be accomplished in one of the following ways:

(1) charge separation or recombination accompanied by increasing or decreasing the localization of molecular electronic states; or (2) change of the extent of conjugation of the molecular electronic states via charge separation or recombination and $\pi$-bond breaking or making.

The present invention provides field switchable molecules that can be assembled easily to make electronic ink, visual displays, electronic books, rewriteable media, and the like, in which the molecules reversibly change color when changing state (e.g., one color to a second color or transparent to color). Such applications are discussed elsewhere, and are not germane to the present invention, except to the extent that the field switchable molecules of the present invention are employed in the construction of apparatus of such applications.

Thus, the molecule is never oxidized nor reduced in the toggling of the switch. Further, the molecule exhibits image contrast and mechanical durability commensurate with ink on paper. Also, the part of the molecule that moves is quite small and free of viscous drag forces, so the switching time should be very fast.

A primary advantage of the molecular system of the present invention is improved contrast. Because the colorant of the present invention is molecular and thus effectively monoplanar, there should be no backside reflection or scattering from the colorant. The background color (e.g., white) of the electronic media is provided by the media substrate or substrate coating and is not compromised by the switchable colorant.

A second advantage of the present invention is improved resolution. In this instance, resolution is only limited by the addressing scheme, since the colorant has molecular dimensions.

A third advantage is that the switching may have a longer lifetime since the switching only involves the charge separation and recombination inside molecules.

Finally, each molecule of the present invention will latch to stabilize one or the other of its color states.

BRIEF DESCRIPTION OF THE DRAWINGS

FIG. 3 is a schematic representation of a first method and apparatus for writing and erasing in accordance with the present invention as shown in FIGS. 1 and 1a;

FIG. 4 is a schematic representation of a second method and apparatus for writing and erasing in accordance with the present invention as shown in FIGS. 1 and 1a;

BEST MODES FOR CARRYING OUT THE INVENTION

Definitions

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "re-configurable" means that a switch can change its state multiple times via a reversible process such as an oxidation or reduction; in other words, the switch can be opened and closed multiple times, such as the memory bits in a random access memory (RAM) or a color pixel in a display.

The term "bi-stable" as applied to a molecule means a molecule having two relatively low energy states separated by an energy (or activation) barrier. The molecule may be either irreversibly switched from one state to the other (singly configurable) or reversibly switched from one state to the other (re-configurable).

Micron-scale dimensions refer to dimensions that range from 1 micrometer to a few micrometers in size.

Sub-micron scale dimensions refer to dimensions that range from 1 micrometer down to 0.05 micrometers.

Nanometer scale dimensions refer to dimensions that range from 0.1 nanometers to 50 nanometers (0.05 micrometers).

Micron-scale and submicron-scale wires refer to rod or ribbon-shaped conductors or semiconductors with widths or diameters having the dimensions of 0.05 to 10 micrometers, heights that can range from a few tens of nanometers to a micrometer, and lengths of several micrometers and longer.

"HOMO" is the common chemical acronym for "highest occupied molecular orbital", while "LUMO" is the common chemical acronym for "lowest unoccupied molecular orbital". HOMOs and LUMOs are responsible for electronic conduction in molecules and the energy difference between the HOMO and LUMO and other energetically nearby molecular orbitals are responsible for the color of the molecule.

An electronic ink, in the context of the present invention, involves switchable changes in the optical and/or electric properties of the molecules, within that spectral region detectable by the human eye. Switching of electronic ink molecules includes changes in properties such as absorption, reflection, refraction, diffraction, and diffuse scattering of electromagnetic waves.

Electronic Ink

Figure 1:
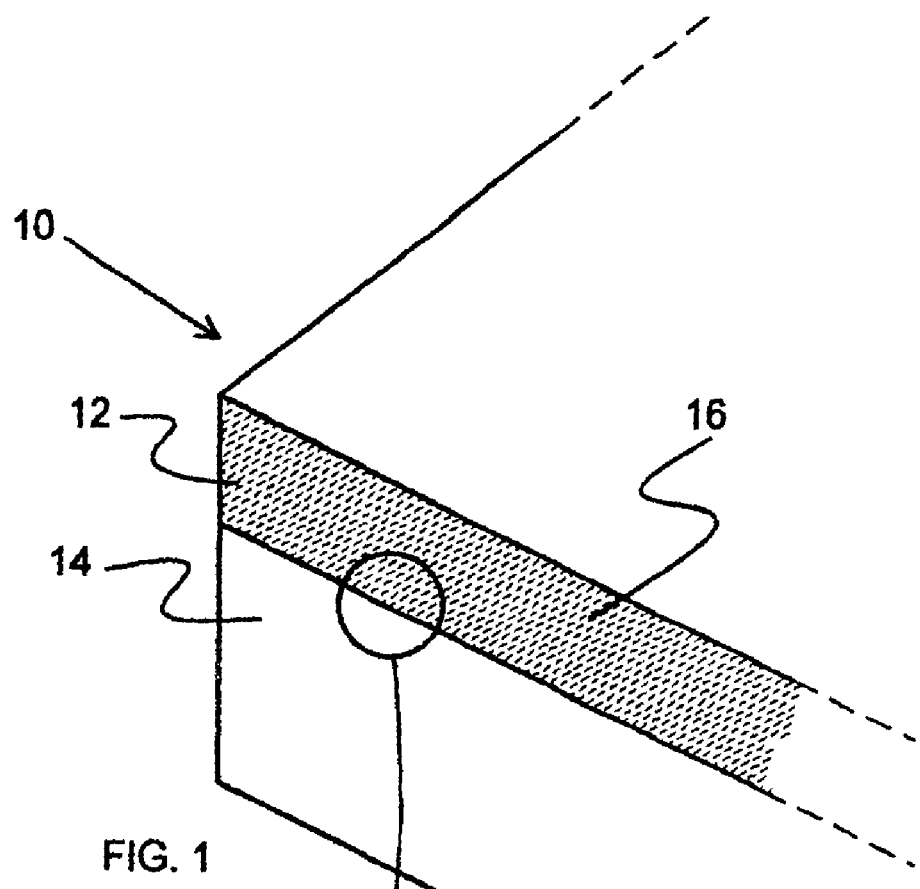
FIG. 1 is a schematic representation (perspective, transparent view) of a two-color (e.g., black and white) display screen construction for use in accordance with the present invention.
Figure 1A:
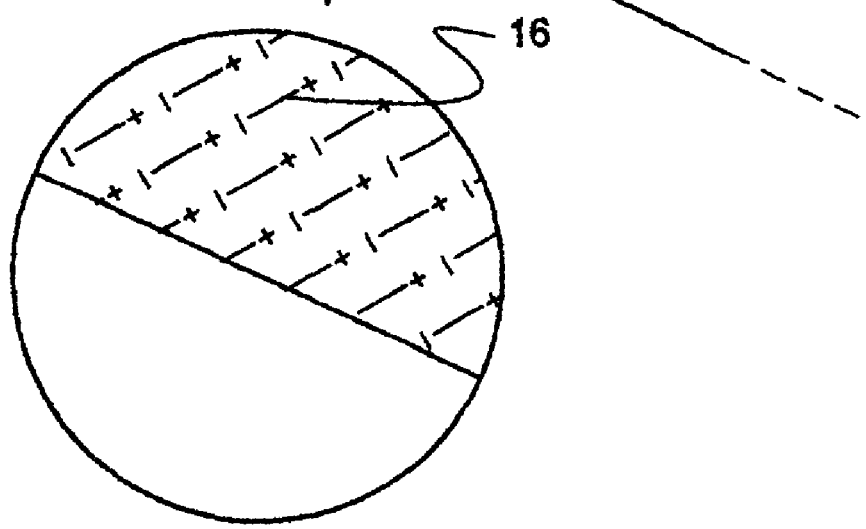
FIG. 1a is an enlargement of a portion of FIG. 1, showing the detail for a colorant layer element of the display screen.

Field addressable rewritable media are described in greater detail in co-pending U.S. application Ser. No. 09/919,394, filed on Jul. 31, 2001, now U.S. Pat. No. 6,556,470, issued Apr. 29, 2003. A generic example taken from that application is depicted herein in FIG. 1. As illustrated schematically in a magnified partial view in FIG. 1, electronic print media 10 comprises an electrochromic coating 12 affixed superadjacently to a backing substrate 14. The electrochromic coating 12 is a molecular colorant coating that contains molecules 16 (represented by greatly magnified lines) that undergo chemical changes as a result of application of an electric field that, in effect, changes selectively localized regions of this coating from one hue to another. In order to describe the print media 10, the electrochromic molecules themselves are depicted as polarized lines 16 in FIG. 1a; however, it should be recognized that there are literally "millions" of such molecules per cubic micrometer of colorant.

It will be immediately apparent that the electrochromic molecular colorants of the present invention are substantially and uniquely different than the microcapsule technology currently employed in electronic inks. Since the molecules of the present invention themselves are changing color in response to an applied electric field, the issues of contrast and image resolution are resolved. In the former case, backside reflection is eliminated, since molecules, not microspheres, are the agents of color change. In the latter case, again, molecules, being much smaller than microspheres, result in greatly improved image resolution, switching speed, out-of-band transparency, and durability.

Figure 2A:
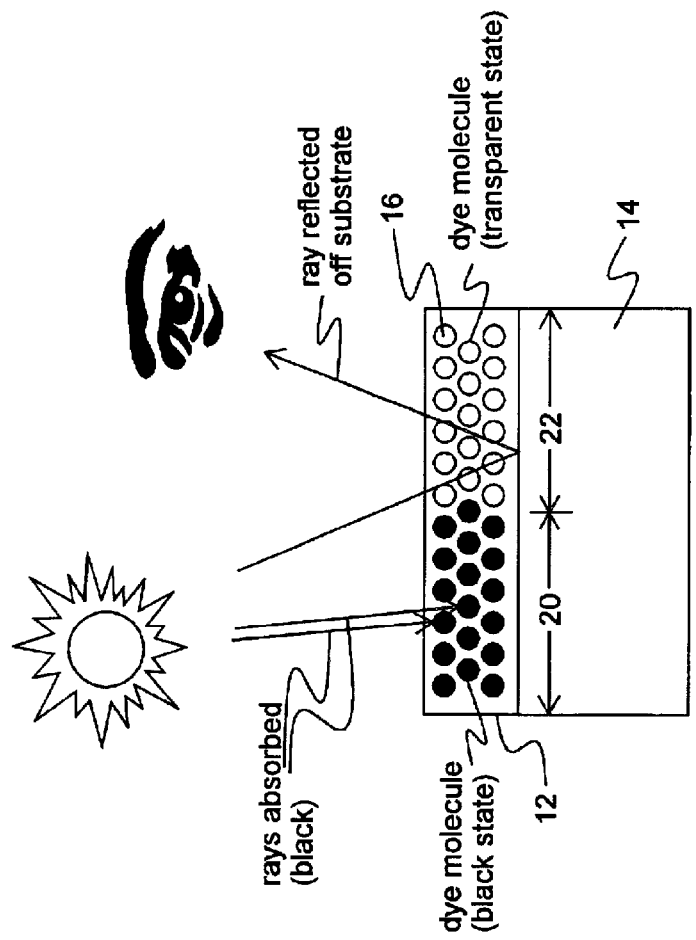
FIG. 2a is a schematic representation (perspective, transparent view) of a full-color display screen construction for use in accordance with the present invention.
Figure 2B:
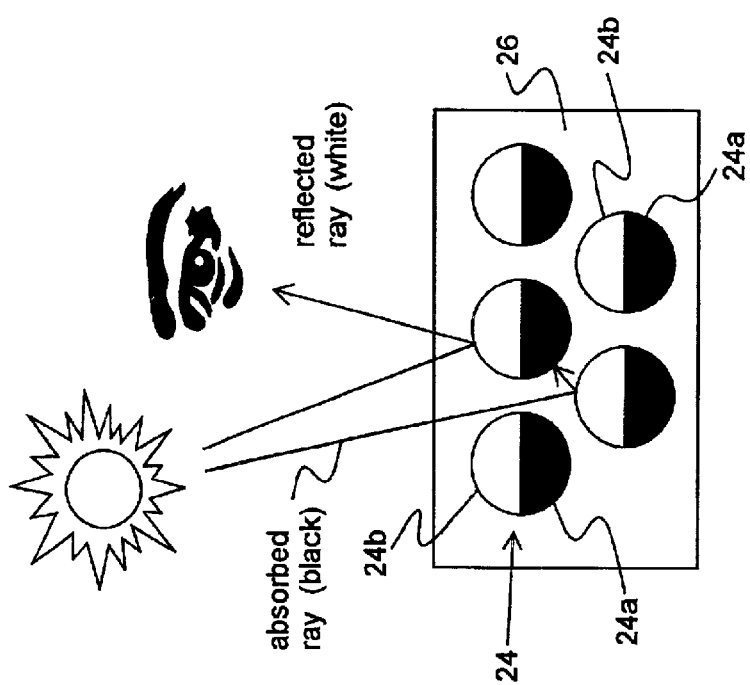
FIG. 2b is a view similar to that of FIG. 2a, but depicting a prior art approach.

With respect to the molecular technology described in greater detail below, the overwhelming advantage of electrochromic molecular colorants over microcapsule technology (see, Background Art, supra) for electronic print media is the realization of standardized print contrast and image resolution. Such use of electrochromic molecular colorants will provide readable content that resembles conventional printing dyes or pigments on paper forms in color mode, color density, and coating layer incorporability. As depicted in FIG. 2a, illustrating a stark contrast to the combined absorption-reflection physics of hemispheric microcapsule technology as depicted in FIG. 2b, in the high color density state 20 (e.g., black), the electrochromic molecular colorant coating 12, comprising molecules 16a, absorbs light uniformly at all light incidence angles to provide conventional ink color density. In the transparent state 22 (FIG. 2a, right side), the bichromal molecules 16b of the present invention do not absorb any visible light appreciably, allowing media substrate 14 to fully show through the coating layer 12. The difference between molecules 16a and 16b is simply the energetic state in which they reside, as discussed more fully below. Thus, to the observer, an electrochromic molecular colorant image appears substantially identical to the image as it would appear in conventional ink print on paper. Namely, gradations of the specific high density color, if any, are invisible to the naked eye. The term "electrochromic molecular colorant" as used herein is expressly intended to include a plurality of different colorant molecules blended to form a layer that can achieve a desired composite color other than the exemplary black state.

Referring to FIG. 2b, which depicts the prior art approach, it is seen that microspheres 24, provided with a black hemisphere 24a and a white hemisphere 24b, are immersed in a liquid 26. Overlapping spheres in multiple layers are needed to achieve adequate color density, limiting pixel resolution to the order of 300 to 400 dots-per-inch ("dpi") (whereas the unaided vision, human eye can discriminate to about 1,000 dpi or better resolution). Displays made from such microcapsules tend to have poor contrast and color because light that penetrates beyond the surface layer reflects off of the backside of subadjacent microcapsules, causing color mixing. As seen in FIG. 2b, poor image contrast arises from backside reflections from each microcapsule. Light entering and penetrating the interstices of a first layer of microcapsules 24 in the media surface coating 26 reflects and is absorbed by the backside 24b, as well as the front side 24a, hemispheres of subsequent microcapsule layers. Low color density areas of the image become darker and high color density areas become lighter than would otherwise occur if the microcapsules were of uniform color throughout their exterior (as is true with pigments and dyes used in conventional printing processes). Thus, in a device using layers of bichromal microcapsules, the image is often actually rendered dark gray against a light gray background.

It will be noted that the electrochromic molecular colorant depicted in FIG. 2a is spatially addressable at its molecular (Angstrom) scale, allowing far greater image resolution than the tens-of-micrometers scale of microcapsule colorants. A molecular wire adaptable for such use is described in U.S. Pat. No. 6,128,214, entitled "Molecular Wire Crossbar Memory" by Philip J. Kuekes et al, issued on Oct. 3, 2000, and assigned to the present assignee, incorporated herein by reference.

Further, the color switching time for the electrochromic molecular colorant pervaded pixel regions of the media 10 is significantly shorter than that for microcapsule colorants, allowing significantly faster imaging speeds, in the main because the electrochromic molecules of the colorant are substantially stationary and change color either through the movement of electrons, the twisting of molecular elements, or both. In each case, the total mass in movement for any addressed pixel is many orders of magnitude smaller than that required with microcapsule colorants.

Still further, electronic media 10 containing the electrochromic molecular colorant coating layer(s) as described in detail hereinafter have the durability of print on conventional media and are not subject to colorant breakage through externally applied pressure in manufacture or use as is media coated with microcapsule colorants.

In one embodiment, depicted in FIGS. 2 and 2a, the electronic media is electric field addressable and is rewritable. The media 10 comprises (a) a bichromal molecular electrochromic molecular colorant impregnated coating liquid vehicle (hereinafter generically referred to as the coating 12 which forms the writable-erasable layer of media 10) and (b) a substrate 14 upon which the coating is affixed.

The substrate 14 may comprise a variety of materials and forms. As one example of typical hard copy application uses, the coating 12 may be affixed onto a flexible plastic material substrate 14 in the approximate size, thickness, and shape of common stationary letterhead. The particular substrate 14 composition implemented is fully dependent on the specific application and, particularly, to the role that the substrate plays in supporting or creating the electric field that is imposed across the coating layer 12.

The coating layer 12 of the media 10 comprises bichromal molecules 16 (FIGS. 1, 1a), or molecules in association with another chemical component, the "vehicle", having an electrical field responsive high color density state (hereinafter simply "color state") and a transparent state. The vehicle may include binders, solvents, flow additives, or other common coating additives appropriate for a given implementation.

Preferably, the colorant of the coating 12 obtains a color state (e.g., black) when subjected to a first electrical field and a transparent state when subjected to a second electrical field. The coating 12, or more specifically, the addressable pixel regions of the media 10, in a preferred embodiment is thus referred to as "bi-stable"; in other words, once set or written, the field targeted, "colored pixel", molecules (the "printed content") remain in the current state until the second field is applied, "erasing" the image by returning the molecules to their transparent state at the field targeted pixels. No holding electrical field is required to maintain the printed content.

Alternatively, the colorant may be monostable, obtaining a localized, first color state (e.g., transparent) when subjected to a localized electrical field, then configuratively relaxing to a second color state (e.g., black) in the absence of the field.

Preferably, the chromatic reaction of each of the aforementioned colorant types is field reversible and bi-stable in the absence of a field so that a field is not required to hold the image and the image may be written, erased, and overwritten many times.

Although very different in constitution, the coating composition employed herein is analogous to conventional coating formulation technology. The constituents will depend on the rheology and adhesion needs of the printing/coating process and substrate material. Typically, the coating layer 12 will comprise 1 to 30 wt % of the solid content of the film deposited to form the coating layer on the substrate 14. This amount is usually determined by desired image color density. The coating 12 will also typically include a polymeric binder to produce a dried or cured coating layer on the substrate 14 in which the electrochromic molecular colorant is suspended. Alternatively, the solids content may include as much as 100% colorant for certain known manner evaporative deposition methods wherein the colorant, or an associated vehicle, is evaporated. In the case of colorant evaporation, there may be no associated vehicle.

In some instances, the colorant must be pre-oriented within the deposited coating layer 12 to allow the optimum alignment with the electrical field that will be used to write and erase a printed content. Such orientation may be achieved by solidifying the deposited coating layer 12 under the influence of a simultaneously applied electric field across the media 10.

In one specific embodiment, the coating 12 comprises electrochromic molecular colorant and a liquidous, ultraviolet (UV) curable, prepolymer (e.g., (meth)acrylate or vinyl monomers/oligomers). The polymer in this instance is formed in situ on the media substrate 10 when subjected to UV radiation. Such prepolymers are well-known in the coatings art.

In a second specific embodiment, coating solidification may occur through thermally activated vehicle chemical reactions common to epoxy, urethane, and thermal free radical activated polymerization.

In a third specific embodiment, coating solidification may occur through partial or total vehicle evaporation.

The colorant may also self-orient through colorant/coating design that allows a self-assembled lattice structure, wherein each colorant monomer aligns with adjacent colorant monomers. Such design and lattice structures, for example, are common to dendrimers and crystals. Processes for self-assembly may include sequential monolayer deposition methods, such as well-known Langmuir film and gas phase deposition techniques.

The substrate 14 should be fabricated of a material having a dielectric constant and electrical conductivity which complements that of the colorant coating layer 12.

Figure 3:
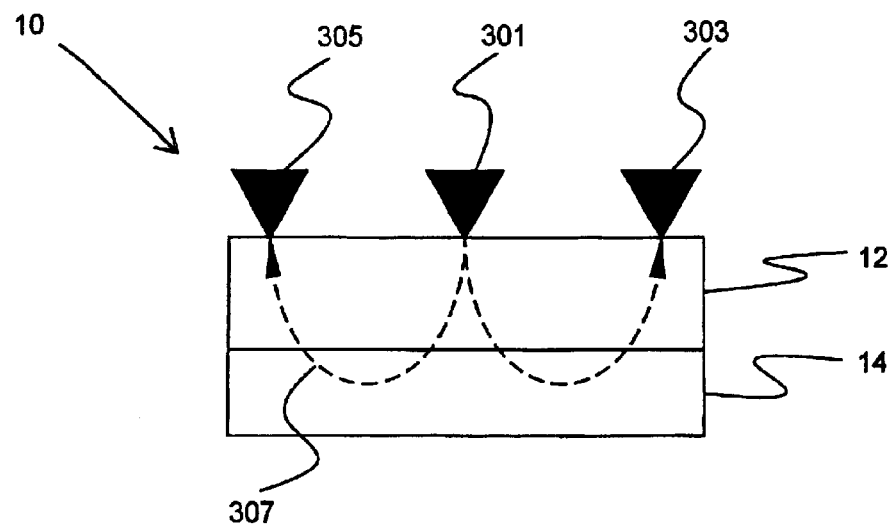

Turning now to FIG. 3, for the implementation such as a simple sheet of rewritable hard copy media or a data storage media 10, it may be desirable to create an electrical writing field from a single coating side, for example, with an electronic pen tip or electrode pair 301 and 303 or 301 and 305, and to entrain the field across the coating layer 12. In such instances, an appropriately low conductivity and dielectric constant colorant coating 12 is desirable to prevent field shunting within the coating layer. The electrical properties of the substrate 14 are less important with such fringe fields (represented by dashed arrow 307) type writing instruments.

Figure 4:
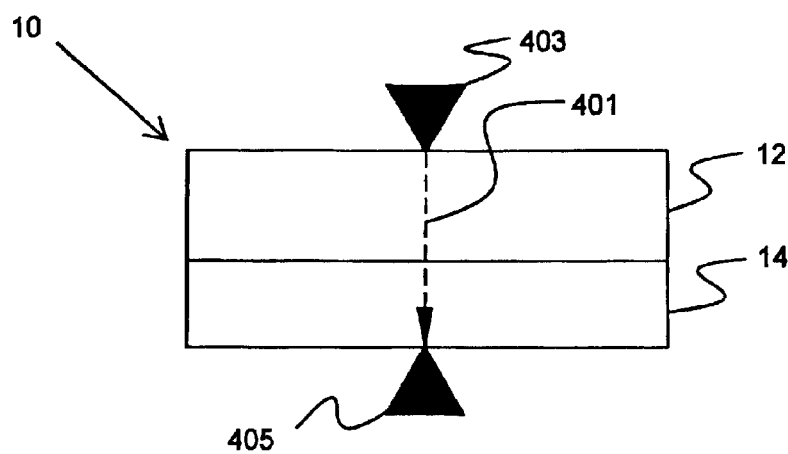

For applications in which it is desirable to create the writing field (dashed arrow 401) through the media 10 thickness, such as depicted in FIG. 4, with electrodes 403, 405 on opposing sides of the media, the substrate 14 preferably has a high dielectric constant, or high electrical conductivity if the adjacent electrode is common to all pixels. These properties minimize the voltage drop (loss) across the substrate 14 to minimize media switching voltage requirements. For example, employable substrates 14 are selected from the group consisting of titania-filled plastics, certain high dielectric constant resin-impregnated papers, and metals.

For certain implementations, e.g., large display boards, it is desirable to coat substrates having an electrode or array of electrodes included on the substrate surface to be coated. Representative substrates include metal-clad fiberboards, printed circuit boards, metallized glass, surface-etched metallized glass, graphite impregnated rubbers and plastics, sheet metals, and the like.

Figure 5:
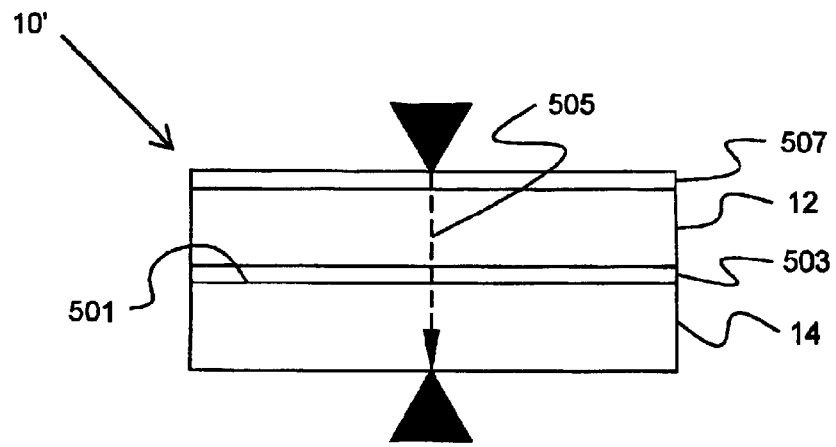
FIG. 5 depicts an alternate embodiment of the present invention as illustrated by FIGS. 1, 3, and 4.

Turning now to FIG. 5, in a more costly embodiment, the media 10' may include a substrate 14 having a reflective substrate 501 coated with a preferred background color layer 503, wherein the background color remains fixed and independent of the imposed electric writing fields (dashed arrow 505). This surface 501 will normally create the background color of the media 10' when the molecular colorant coating layer 12 is switched to the transparent state. Such surface coatings generally comprise a conventional pigment or colorant incorporated in a polymer binder. As with the substrate 14, the coating layer 503 comprises a binder and colorant of a composition chosen to maintain the integrity of the electric field 505 imposed on the media 10' and to minimize additional voltage drop across the media. Alternatively, a conventional pigment or colorant may be incorporated into the substrate 14 itself. Such surface coating and incorporated substrate coloration fabrication processes are well-known in the media art.

The media 10' may further include a protective surface layer 507. In general, the protective surface layer 507 is visibly transparent and protects the colorant coating 12 from abrasion, photo-oxidative color fade, chemical decomposition, or other environmentally-imposed factors that may alter the integrity of the media 10'. Fabrication of the protective surface layer 507 can be performed in a known manner, such as a polymeric coating, a transparent material deposition, or a laminate. As examples, polymethyl methacrylate and polyurethane type polymeric coatings are known to contain ultraviolet radiation absorbing additives; thin film, vapor deposited, glass and polymer laminate films may also be employed. Methods of layer application are also well-known in the art. As with the substrate 14, the protective surface layer is preferably composed to maintain the integrity of the electric field imposed on the media 10' and to minimize additional voltage drop across the media.

Present Invention

In accordance with the present invention, a molecule system is provided that comprises an electric (E) field induced change of substantial conjugation via chemical bonding change. The change of substantial conjugation may be accomplished in one of the following ways:

(1) charge separation or recombination accompanied by increasing or decreasing molecular electronic state localization; or (2) change of an extent of the conjugation of the molecular electronic states via charge separation or recombination and dπ-bond breaking or making.

E-Field Induced Band Gap Change Caused by the Change of Extended Conjugation via Charge Separation or Recombination Accompanied by Increasing or Decreasing Localization of the Molecular Electronic States (or Electronic States in the Molecule)

Figure 6A:
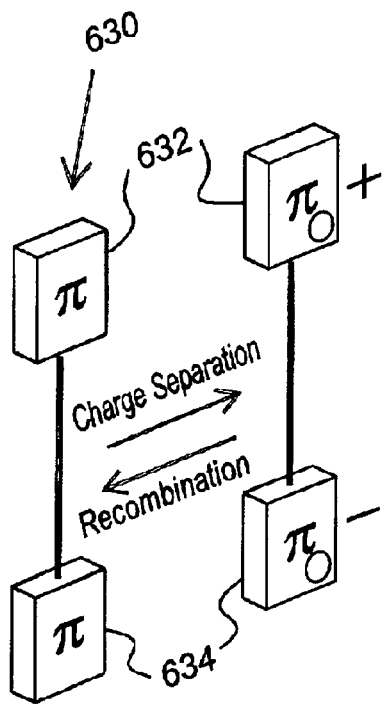
FIG. 6a is a schematic model depicting an electric field-induced band gap change caused by the change of substantial conjugation via charge separation or recombination accompanied by increasing or decreasing band localization.

FIG. 6a schematically depicts this model, which involves an E-field-induced band gap change caused by the change of extended conjugation via charge separation or recombination accompanied by increasing or decreasing localization of the electronic states in the molecule. As shown in FIG. 6a, the molecule 630 comprises two portions 632 and 634. The molecule 630 evidences a larger band gap state, with less π-delocalization. Application of an electric field causes charge separation in the molecule 630, resulting in a smaller band gap state, with better π-delocalization. Recombination of the charges returns the molecule 630 to its original state.

The following requirements must be met in this model:

(a) The molecule must have a modest dielectric constant $\in_r$ and can be easily polarized by an external E-field, with $\in_r$ in the range of 2 to 10 and polarization fields ranging from 0.01 to 10 V/nm;

(b) At least one segment of the molecule must have non-bonding electrons, or π-electrons, or π-electrons and non-bonding electrons that can be mobilized over the entire molecule or a part of the molecule;

(c) The molecule can be symmetrical or asymmetrical;

(d) The inducible dipole(s) of the molecule can be oriented in at least one direction;

(e) The charges will be separated either partially or completely during E-field induced polarization;

(f) The states of charge separation or recombination can be E-field dependent or bi-stable, stabilized through inter- or intra-molecular forces such as covalent bond formation, hydrogen bonding, differences in electron affinities of different fragments of the molecule, Coulomb forces, metal complex formation, or Lewis acid (base) complex interactions, etc.;

(g) The process of charge separation or recombination of the molecule may or may not involve σ- and π-bond breakage or formation; and (h) During the charge separation or re-combination process activated by an E-field, the band (HOMO-LUMO) gap of the molecule will change depending on the degree of the non-bonding electron, or π-electron, or π-electron and non-bonding electron de-localization in the molecule. Both optical and electrical properties of the molecules will change accordingly.

One example of an E-field induced band gap change (color change) via charge separation or recombination involving bond breaking or bond making is shown below (Example 1):

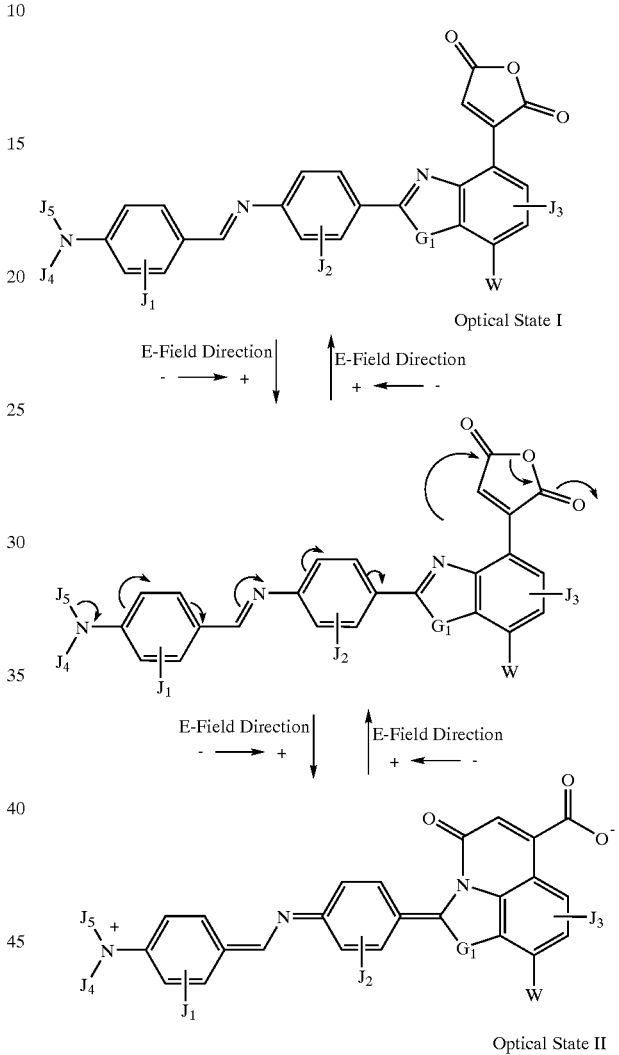

EXAMPLE 1 where:

The letters $J_1$, $J_2$, $J_3$, $J_4$ and $J_5$ represent tuning groups built into the molecule. The function of these tuning groups (e.g., OH, NHR, COOH, CN, nitro, etc.) is to provide an appropriate functional effect (e.g., both inductive effect and resonance effects) and/or steric effects. The functional effect is to tune the band gap ($\Delta E_{HOMO/-LUMO}$) of the molecule to get the desired electronic as well as optical properties of the molecule. The steric effect is to tune the molecule conformation through steric hindrance, inter- or intra-molecular interaction forces (e.g., hydrogen bonding, Coulomb interaction, van der Waals forces) to provide bi- or multiple-stability of molecular orientation. They may be any one of the following: hydrogen, hetero atom (e.g., N, O, S, P, B, F, Cl, Br and I), functional group with at least one of above-mentioned hetero atoms, hydrocarbon (either saturated or unsaturated) or substituted hydrocarbon.

The letter $G_1$ is a bridging group. The function of the bridging group is to connect two or more conjugated rings to achieve a desired chromophore. The bridging group may be any one of the following: hetero atoms (e.g., N, O, S, P, etc.) or functional group with at least one of above-mentioned hetero atoms (e.g., NH, etc.), hydrocarbon or substituted hydrocarbon.

The letter W is an electron-withdrawing group. The function of this group is to tune the reactivity of the maleic anhydride group of this molecule, which enables the molecule to undergo a smooth charge separation or recombination (bond breaking or formation, etc.) under the influence of an applied external E-field. The electron withdrawing group may be any one of the following: carboxylic acid or its derivatives (e.g., ester or amide etc.), nitro, nitrile, ketone, aldehyde, sulfone, sulfuric acid or its derivatives, hetero atoms (e.g., F, Cl, Br, N, O, S, etc.) or functional group with at least one of the hetero atoms (e.g., F, Cl, Br, N, O, S, etc.).

An example of an E-field induced band gap change involving the formation of a molecule-metal complex or a molecule-Lewis acid complex is shown below (Example 2):

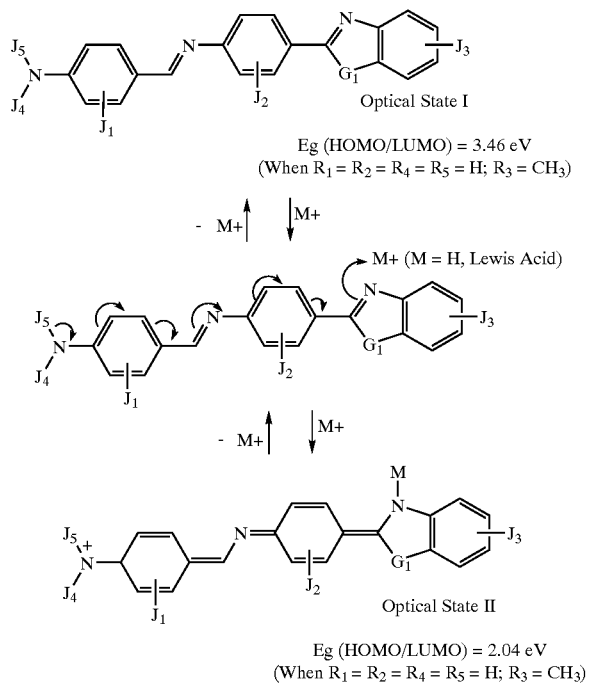

EXAMPLE 2 where:

The letters $J_1$, $J_2$, $J_3$, $J_4$ and $J_5$ represent tuning groups built into the molecule. The function of these tuning groups (e.g., OH, NHR, COOH, CN, nitro, etc.) is to provide an appropriate functional effect (e.g. both inductive and resonance effects) and/or steric effects. The functional effect is to tune the band gap ($\Delta E_{HOMO/LUMO}$) of the molecule to get the desired electronic as well as optical properties of the molecule. The steric effect is to tune the molecular conformation through steric hindrance, inter- or intra-molecular interaction forces (e.g., hydrogen bonding, Coulomb interaction, van der Waals forces) to provide bi- or multiple-stability of the molecular orientation. They may be any one of the following: hydrogen, hetero atom (e.g., N, O, S, P, B, F, Cl, Br, and I), functional group with at least one of the above-mentioned hetero atoms, hydrocarbon (either saturated or unsaturated) or substituted hydrocarbon.

The letter $G_1$ is a bridging group. The function of the bridging group is to connect two or more conjugated rings to achieve a desired chromophore. The bridging group may be any one of the following: hetero atoms (e.g., N, O, S, P, etc.) or functional group with at least one of above-mentioned hetero atoms (e.g., NH, etc.) or substituted hydrocarbon.

$M^+$ represents metals, including transition metals, or their halogen complexes or $H^+$ or other type of Lewis acid(s).

Figure 6B:
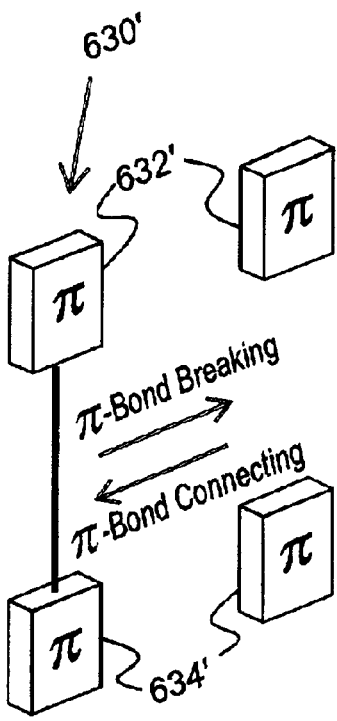
FIG. 6b is a schematic model depicting an electric field-induced band gap change caused by change of substantial conjugation via charge separation or recombination and $\pi$-bond breaking or formation.

E-Field Induced Band Gap Change Caused by the Change of Extended Conjugation via Charge Separation or Recombination and π-Bond Breaking or Making FIG. 6b is a schematic depiction of this model, which involves an E-field-induced band gap change caused by the change of extended conjugation via charge separation or recombination and π-bond breaking or formation. As shown in FIG. 6b, the molecule 630' comprises two portions 632' and 634'. The molecule 630' evidences a smaller band gap state. Application of an electric field causes breaking of the π-bond in the molecule 630', resulting in a larger band gap state. Reversal of the E-field re-connects the π-bond between the two portions 632' and 634' and returns the molecule 630' to its original state.

The requirements that must be met in this model are the same as listed for the previous model.

One example of an E-field induced band gap change cause by extended conjugation via charge separation (σ-bond breaking and π-bond formation) is shown below (Example 3):

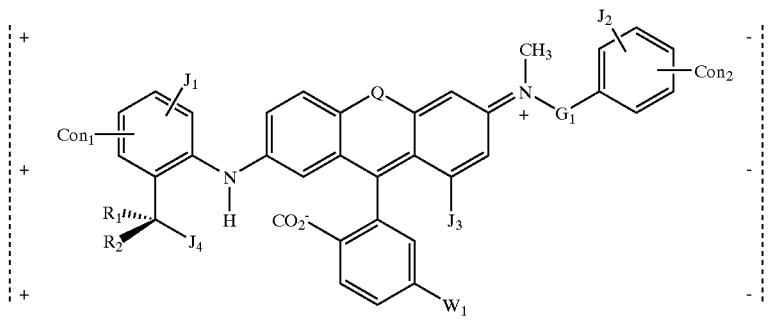

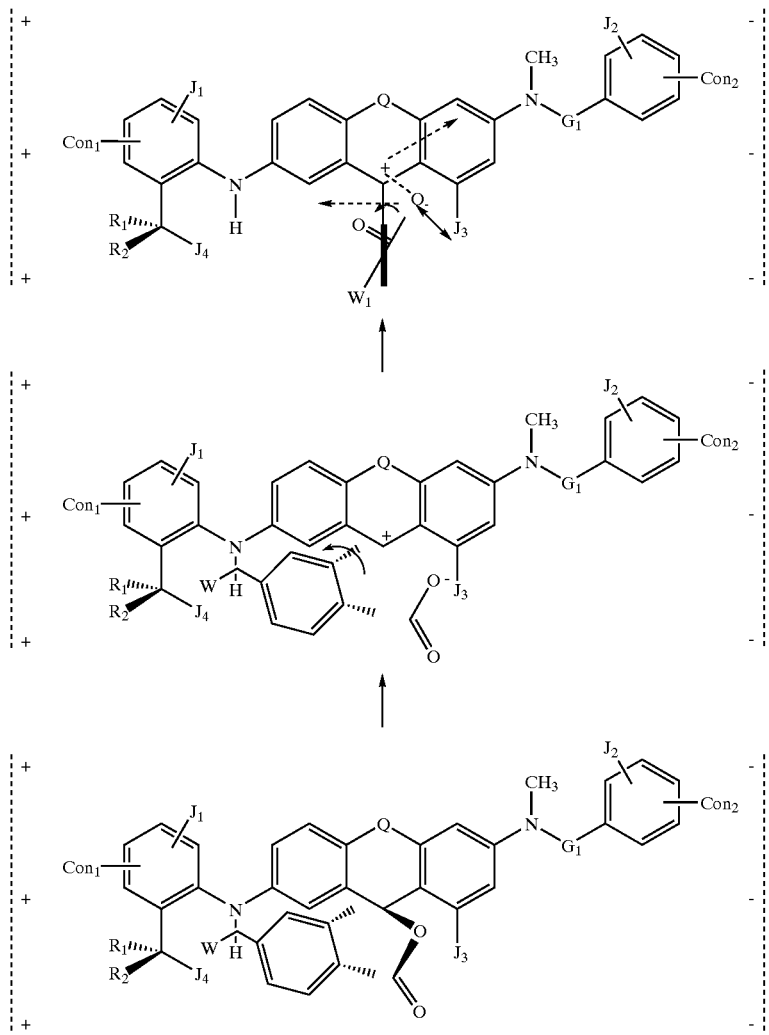

EXAMPLE 3 where:

The letter Q is used here to designate a connecting unit between two phenyl rings. It can be any one of following: S, O, NH, NR, hydrocarbon, or substituted hydrocarbon.

The letters $Con_1$ and $Con_2$ are optional connecting groups between one molecule and another molecule or between a molecule and a solid substrate (e.g., metal electrode, inorganic or organic substrate, etc.). They may be any one of the following: hydrogen (through a hydrogen bond), hetero atoms (i.e., N, O, S, P, etc.) or functional groups with at least one of above-mentioned hetero atoms (e.g., NH, etc.), hydrocarbons (either saturated or unsaturated) or substituted hydrocarbons.

The letters $R_1$ and $R_2$ represent spacing groups built into the molecule. The function of these spacer units is to provide an appropriate 3-dimensional scaffolding to allow the molecules to pack together while providing rotational space for the lower part of the molecule. They may be any one of the following: hydrogen, hydrocarbons (either saturated or unsaturated) or substituted hydrocarbons.

The letters $J_1$, $J_2$, $J_3$ and $J_4$ represent tuning groups built into the molecule. The function of these tuning groups (e.g., OH, NHR, COOH, CN, nitro, etc.) is to provide an appropriate functional effect (e.g. both inductive and resonance effects) and/or steric effects. The functional effect is to tune the band gap ($\Delta E_{HOMO/LUMO}$) of the molecule to get the desired electronic as well as optical properties of the molecule. The steric effect is to tune the molecular conformation through steric hindrance, inter- or intra-molecular interaction forces (e.g., hydrogen bonding, Coulomb interaction, van der Waals forces) to provide bi- or multiple-stability of molecular orientation. They may also be used as spacing group to provide an appropriate 3-dimensional scaffolding to allow the molecules to pack together while providing rotational space for the lower part of the molecule. They may be any one of the following: hydrogen, hetero atom (e.g., N, O, S, P, B, F, Cl, Br, and J), functional group with at least one of above-mentioned hetero atom, hydrocarbon (either saturated or unsaturated) or substituted hydrocarbon.

The letter $G_1$ is a bridging group. The function of the bridging group is to connect two or more conjugated rings to achieve a desired chromophore. The bridging group may be any one of the following: hetero atoms (e.g., N, O, S, P, etc.) or functional groups with at least one of above-mentioned hetero atoms (e.g., NH or NHNH, etc.), hydrocarbon (either saturated or unsaturated) or substituted hydrocarbon.

The letter W is an electron-withdrawing group. The function of this group is to tune the reactivity of the lactone group of this molecule, which enables the molecule to undergo a smooth charge separation or recombination (bond breaking or formation, etc.) under the influence of an applied external E-field. The electron-withdrawing group may be any one of the following: carboxylic acid or its derivatives (e.g., ester or amide etc.), nitro, nitrile, ketone, aldehyde, sulfone, sulfuric acid or its derivatives, hetero atoms (e.g., F, Cl, etc.) or functional group with at least one of hetero atoms (e.g., F, Cl, Br, N, O and S, etc.), hydrocarbon (either saturated or unsaturated) or substituted hydrocarbon.

The uppermost molecular structure has a smaller band gap state than the lowermost molecular structure.

Another example of an E-field induced band gap change caused by breakage of extended π-bond conjugation via charge recombination and σ-bond formation is shown below (Example 4):

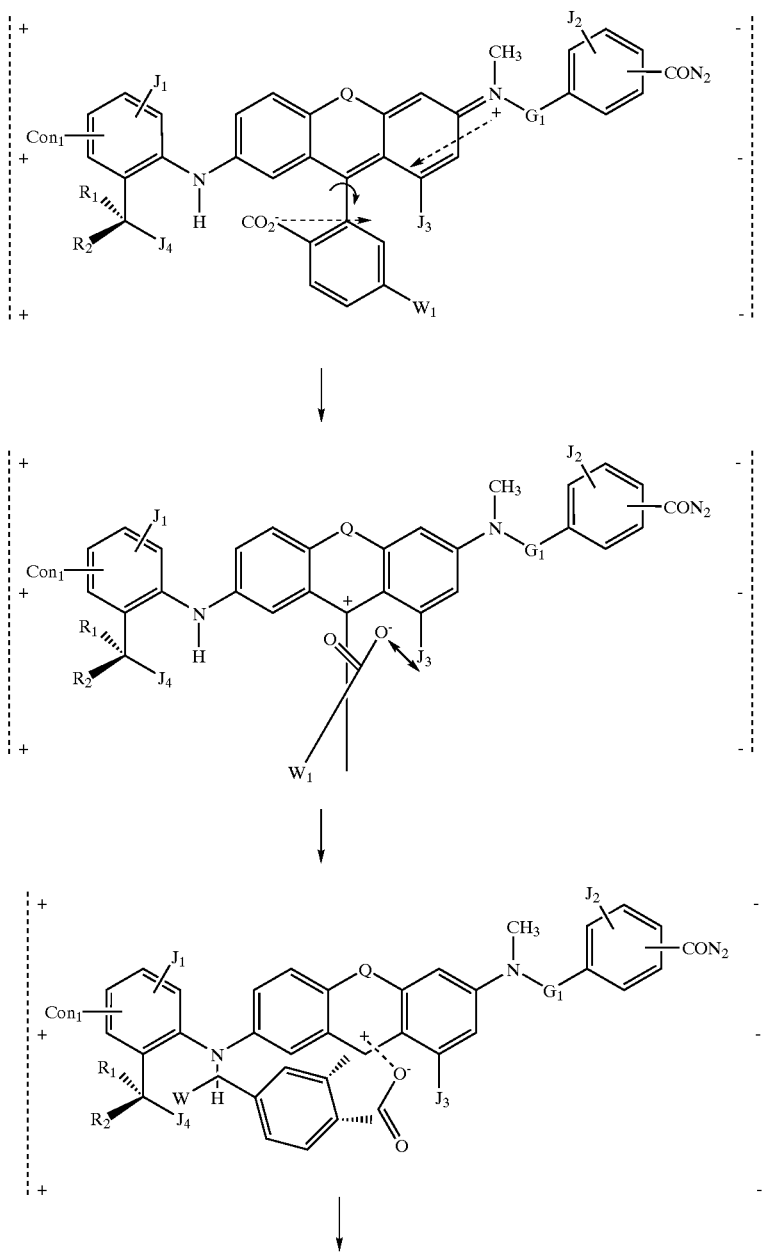

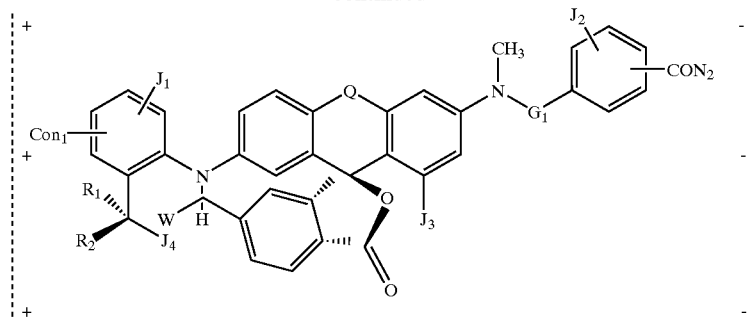

EXAMPLE 4 where:

The letter Q is used here to designate a connecting unit between two phenyl rings. It can be any one of following: S, O, NH, NR, hydrocarbon, or substituted hydrocarbon.

The letters $Con_1$ and $Con_2$ are optional connecting groups between one molecule and another molecule or between a molecule and a solid substrate (e.g., metal electrode, inorganic or organic substrate, etc.). They may be any one of the following: hydrogen, hetero atoms (i.e., N, O, S, P, etc.) or functional group with at least one of above-mentioned hetero atoms (e.g., NH, etc.), hydrocarbon (either saturated or unsaturated) or substituted hydrocarbon.

The letters $R_1$ and $R_2$ represent spacing groups built into the molecule. The function of these spacer units is to provide an appropriate 3-dimensional scaffolding to allow the molecules to pack together while providing rotational space for the lower part of the molecule. They may be any one of the following: hydrogen, hydrocarbon (either saturated or unsaturated) or substituted hydrocarbon.

The letters $J_1$, $J_2$, $J_3$ and $J_4$ represent tuning groups built into the molecule. The function of these tuning groups (e.g., OH, NHR, COOH, CN, nitro, etc.) is to provide an appropriate functional effect (e.g., both inductive and resonance effects) and/or steric effects. The functional effect is to tune the band gap ($\Delta E_{HOMO/LUMO}$) of the molecule to get the desired electronic as well as optical properties of the molecule. The steric effect is to tune the molecule conformation through steric hindrance, inter- or intra-molecular interaction forces (e.g. hydrogen bonding, Coulomb interaction, van der Waals forces) to provide bi- or multiple-stability of molecular orientation. They may also be used as spacing groups to provide an appropriate 3-dimensional scaffolding to allow the molecules to pack together while providing rotational space for the lower part of the molecule. They may be any one of the following: hydrogen, hetero atom (e.g., N, O, S, P, B, F, Cl, Br, and I), functional groups with at least one of above-mentioned hetero atom, hydrocarbon (either saturated or unsaturated) or substituted hydrocarbon.

The letter $G_1$ is a bridging group. The function of this bridging group is to connect two or more conjugated rings to achieve a desired chromophore. The bridging group may be any one of the following: hetero atoms (e.g., N, O, S, P, etc.) or functional group with at least one of above-mentioned hetero atoms (e.g., NH or NHNH, etc.), hydrocarbon (either saturated or unsaturated) or substituted hydrocarbon.

The letter W is an electron-withdrawing group. The function of this group is to tune the reactivity of the lactone group of this molecule, which enables the molecule to undergo a smooth charge separation or recombination (bond breaking or formation, etc.) under the influence of an applied external E-field. The electron-withdrawing group may be any one of the following: carboxylic acid or its derivatives (e.g., ester or amide, etc.), nitro, nitrile, ketone, aldehyde, sulfone, sulfuric acid or its derivatives, hetero atoms (e.g., F, Cl etc.) or functional group with at least one of hetero atoms (e.g., F, Cl, Br, N, O, S, etc.), hydrocarbon (either saturated or unsaturated) or substituted hydrocarbon.

Again, the uppermost molecular structure has a smaller band gap state than the lowermost molecular structure.

The present invention turns ink or dye molecules into active devices that can be switched with an external electric field by a mechanism completely different from any previously described electro-chromic or chromogenic material. The general idea is to use modified Crystal Violet lactone types of molecules in which the C—O bond of the lactone is sufficiently labile enough and can undergo a bond breaking and forming (see Examples 3 and 4 above) under the influence of an applied electric field.

A positive and a negative charge are generated during the C—O bond breaking process. The resulting charges will be separated and move in opposite directions parallel to the applied external field (upper part of the molecule), or bond rotation (lower part of the molecule. The upper most region of the molecule with a partial extended dipole is completely conjugated, and a color (red-shift) results (see Example 3). However, the molecule is designed to have inter- and/or intra-molecular forces, such as hydrogen bonding, Coulomb, or dipole—dipole interactions as well as steric repulsions, or by a permanent external E-field to stabilize both charges in this particular orientation. Thus, a large field is required to unlatch the molecule from its initial orientation. Once switched into a particular orientation, the molecule will remain in that orientation until it is switched out.

When a reverse E-field is applied (Example 4), both charges tend to realign themselves to the direction of the reverse external field. The positive charge on the upper part of the molecule will migrate to the center part of the molecule (tri-aryl methane position) from the side of the molecule through the non-bonding electron, or π-electron, or π-electron and non-bonding electron delocalization. Likewise, the negative charged lower part of the molecule will tend to move closer to the external E-field through C—C bond rotation. A key component of the molecule design is that there is a steric and static repulsion between the $CO_2^-$ and the $J_3$ and $J_4$ groups that will prevent the lower part of the molecule (the negative charged sector) from rotating through a complete 180 degree half cycle. Instead, the rotation is halted by the steric interaction of bulky groups on the lower part and the upper part at an angle of approximately 90 degrees from the initial orientation. Furthermore, this 90 degree orientation is stabilized by a C—O bond formation and charge recombination. During this process, a tetrahedral carbon (an isolator) is formed at the tri-aryl methane position. The conjugation of the molecule is broken and the p- and π-electrons are no longer delocalized over the uppermost part of the molecule. This has the effect of shrinking the size of the volume occupied by the electrons, which causes the HOMO-LUMO gap to increase. A blue-shifted color or transparent state will result during this process.

For colored ink and dye molecules, the limitation of the positive charge migration just between one side of a molecule and the center position is crucial. Another important factor is the ability to switch the lower part of molecule between two states separated by an optically significant angle (nominally 10 to 170 degrees) from the upper part of the molecule. When the intra-molecular charges separation reaches a maximum distance, then the uppermost part of the molecule becomes completely conjugated. Thus, the π-electrons or π-electrons and non-bonding electrons of the molecule are delocalized over the upper most regions. The effect is identical to that for a quantum mechanical particle in a box: when the box is the size of the entire molecule, i.e., when the p- and π-electrons are delocalized, then the gap between the HOMO and LUMO is relatively small. In this case, the HOMO-LUMO gap of the molecule is designed to yield the desired color of the ink or dye. The HOMO-LUMO gap for the all-parallel structure can be tuned by substituting various chemical groups ($J_1$, $J_2$, $J_3$, $J_4$, and W) onto the different aromatic rings of the molecule. In the case where the lower part of the molecule is rotated by 10 to 170 degrees with respect to the upper part of the molecule, depending on the nature of the chemical substituents ($J_1$, $J_2$, $J_3$, $J_4$, and W) bonded to the upper and lower parts of the molecule, then the increased HOMO-LUMO gap will correspond to a color that is blue-shifted with respect to the color of the all-parallel structure. With sufficient shifting, the molecule becomes transparent, if the new HOMO-LUMO gap is large enough. Thus, the molecule is switchable between two colors or from one color to a transparent state.

Examples 3 and 4 show two different states of a representative switchable molecule under the influence of an externally applied E-field. For this particular type of molecule, a sufficiently thick molecular film is grown, for example using Langmuir-Blodgett techniques, vapor phase deposition, or electrochemical deposition, such that the orientation axis of the molecules is perpendicular to the plane of the electrodes used to switch the molecules. Another deposition technique is to suspend the molecule as a monomer/oligomer or solvent-based solution that is thick film coated (e.g., reverse roll) or spin-coated onto the substrate and subsequently polymerized (e.g., by UV radiation) or dried while the coating is subjected to an electric field that orients the molecule. A top electrode may be a transparent conductor, such as indium-tin oxide, and the films are grown such that the molecular axis is parallel to the plane of the electrodes. The molecules form solid-state or liquid crystals in which one part of the molecule (here, the upper part) is locked into position by intermolecular interactions or direct bonding to a support structure, but another part of the molecule (here, the lower part) is small enough to move within the lattice of the molecules.

The following Examples 5 and 6 are examples of another class of E-field dependent electrochromic organic colorants. The molecules depicted here are differentiated from those earlier mentioned examples (Examples 3 and 4) in that these molecules are E-field dependent to maintain the switched color. These examples show two different states of a representative switchable molecule with or without the influence of an externally applied E-field. The uppermost molecular structure in both Examples 5 and 6 has a smaller band gap state than the lowermost molecular structure.

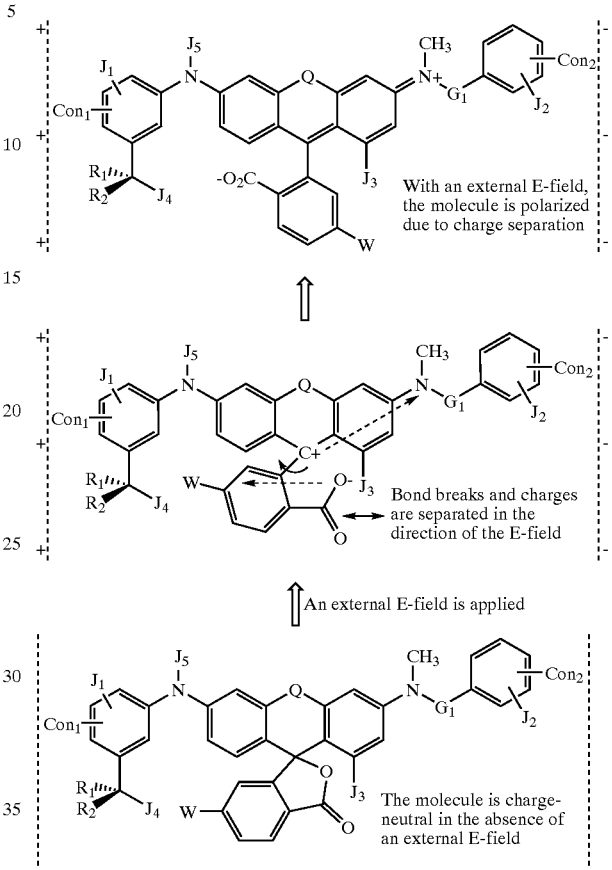

EXAMPLE 5

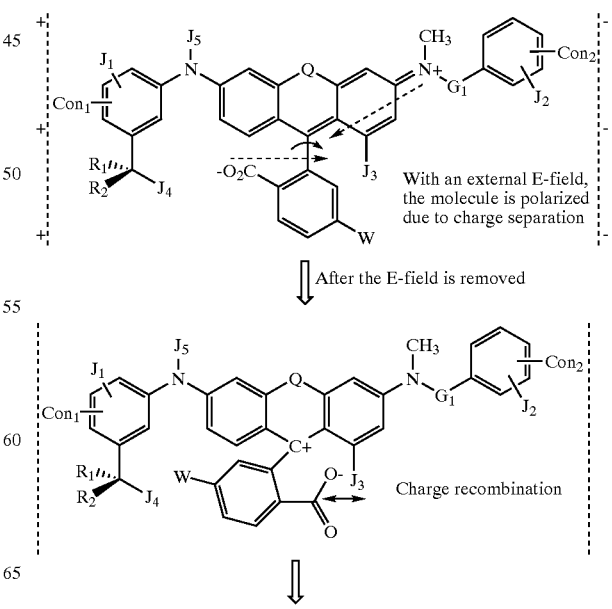

-continued

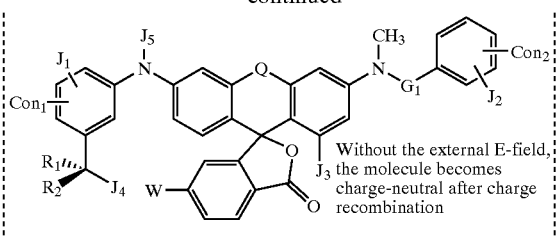

Without the external E-field, J₃ the molecule becomes charge-neutral after charge recombination

EXAMPLE 6 where:

The letter Q is used here to designate a connecting unit between two phenyl rings. It can be any one of following: S, O, NH, NR, hydrocarbon, or substituted hydrocarbon.

The letters $Con_1$ and $Con_2$ are optional connecting groups between one molecule and another molecule or between a molecule and a solid substrate (e.g., metal electrode, inorganic or organic substrate, etc.). They may be any one of the following: hydrogen (through a hydrogen bond), hetero atoms (i.e., N, O, S, P, etc.) or functional groups with at least one of above-mentioned hetero atoms (e.g., NH, etc.), hydrocarbons (either saturated or unsaturated) or substituted hydrocarbons.

The letters $R_1$ and $R_2$ represent spacing groups built into the molecule. The function of these spacer units is to provide an appropriate 3-dimensional scaffolding to allow the molecules to pack together while providing rotational space for the lower part of the molecule. They may be any one of the following: hydrogen, hydrocarbons (either saturated or unsaturated) or substituted hydrocarbons.

The letters $J_1$, $J_2$, $J_3$, $J_4$ and $J_5$ represent tuning groups built into the molecule. The function of these tuning groups (e.g., H, $CH_3$, OH, NHR, COOH, CN, nitro, etc.) is to provide an appropriate functional effect (e.g. both inductive and resonance effects) and/or steric effects. The functional effect is to tune the band gap ($\Delta E_{HOMO/LUMO}$) of the molecule to get the desired electronic as well as optical properties of the molecule. The steric effect is to tune the molecular conformation through steric hindrance, inter- or intra-molecular interaction forces (e.g., hydrogen bonding, Coulomb interaction, van der Waals forces) to provide bi- or multiple-stability of molecular orientation. They may also be used as spacing group to provide an appropriate 3-dimensional scaffolding to allow the molecules to pack together while providing rotational space for the lower part of the molecule. They may be any one of the following: hydrogen, hetero atom (e.g., N, O, S, P, B, F, Cl, Br, and I), functional group with at least one of above-mentioned hetero atom, hydrocarbon (either saturated or unsaturated) or substituted hydrocarbon.

The letter $G_1$ is a bridging group. The function of the bridging group is to connect two or more conjugated rings to achieve a desired chromophore. The bridging group may be any one of the following: hetero atoms (e.g., N, O, S, P, etc.) or functional groups with at least one of above-mentioned hetero atoms (e.g., NH or NHNH, etc.), hydrocarbon (either saturated or unsaturated) or substituted hydrocarbon.

The letter W is an electron-withdrawing group. The function of this group is to tune the reactivity of the lactone group of this molecule, which enables the molecule to undergo a smooth charge separation or recombination (bond breaking or formation, etc.) under the influence of an applied external E-field. The electron-withdrawing group may be any one of the following: carboxylic acid or its derivatives (e.g., ester or amide etc.), nitro, nitrile, ketone, aldehyde, sulfone, sulfuric acid or its derivatives, hetero atoms (e.g., F, Cl, etc.) or functional group with at least one of hetero atoms (e.g., F, Cl, Br, N, O and S, etc.), hydrocarbon (either saturated or unsaturated) or substituted hydrocarbon.

As with Examples 3 and 4, the general idea is to use modified Crystal-violet-lactone type of molecules in which the C—O bond of the lactone is sufficiently labile enough and can undergo a bond breaking and forming (see Examples 5 and 6 above) under the influence of an applied electric field.

A positive and a negative charge are generated during the C—O bond breaking process when an external E-field is applied to the molecule. The resulting charges will be separated and move in opposite directions parallel to the applied external field (both the upper part of the molecule and a lower part of the molecule). The positively charged upper part of the molecule is completely conjugated, and a color (red-shift) results (see Example 5). This colored state will be maintained as long as the externally E-field is applied.

When the external E-field is removed (Example 6), the positive charge on the upper part of the molecule will migrate to the center part of the molecule (tri-aryl methane position) from the side of the molecule through the non-bonding electron, or π-electron, orπ-electron and non-bonding electron delocalization. Likewise, the negative charged lower part of the molecule will tend to move closer to the internal E-field through C—C bond rotation, and a C—O bond formation and charge recombination resulted due to the force of internal E-field and Coulomb attraction. During this process, a tetrahedral carbon (an insulator) is formed at the tri-aryl methane position. The extended conjugation of upper-portion of the molecule is broken. This has the effect of shrinking the size of the volume occupied by the electrons, which causes the HOMO-LUMO gap to increase. A blue-shifted color or transparent state will result during this process.

When the charge separation reaches a maximum distance under the influence of externally applied E-field, the upper most part of the molecule becomes completely conjugated. The effect is identical to that for a quantum mechanical particle in a box: when the box is equal in size to the size of the entire molecule, i.e., when the p- andπ-electrons are fully delocalized, then the gap between the HOMO and LUMO is relatively small. In this case, the HOMO-LUMO gap of the molecule is designed to yield the desired color of the ink or dye. The HOMO-LUMO gap for the all-parallel structure can be tuned by substituting various chemical groups ($J_1$, $J_2$, $J_3$, $J_4$, $J_5$ and W) into the different aromatic rings of the molecule. The increased HOMO-LUMO gap will correspond to a color that is blue-shifted with respect to the color of the all-parallel structure. With sufficient shifting, the molecule becomes transparent, if the new HOMO-LUMO gap is large enough. Thus, the molecule is switchable between two colors or from one color to a transparent state.

Examples 5 and 6 show two different states of a representative switchable molecule under the influence of an externally applied E-field. For this particular type of molecule, a sufficiently thick molecular film is grown, for example using Langmuir-Blodgett techniques, vapor phase deposition, or electrochemical deposition, such that the orientation axis of the molecules is perpendicular to the plane of the electrodes used to switch the molecules. Another deposition technique is to suspend the molecule as a monomer/oligomer or solvent-based solution that is thick film coated (e.g., reverse roll) or spin-coated onto the substrate and subsequently polymerized (e.g., by UV radiation) or dried while the coating is subjected to an electric field that orients the molecule. A top electrode may be a transparent conductor, such as indium-tin oxide, and the films are grown such that the molecular axis is parallel to the plane of the electrodes.

INDUSTRIAL APPLICABILITY

The field-switchable molecules disclosed herein are expected to find use in electronic ink applications as well as a variety of visual displays, sensors, and detectors.

What is claimed is:

1. A switchable medium for a visual display comprising an electric field activated molecular system configured within an electric field generated by a pair of electrodes, said molecular system having an electric field induced band gap change that occurs via a reversible or irreversible change of extent of the electron conjugation in the molecule via chemical bonding change to change the band gap, wherein in a first state, there is conjugation throughout the molecular system, term, resulting in a first band gap, and wherein in a second state, the conjugation is changed, resulting in a second band gap, where said second band gap is larger than said first band gap.

2. The switchable medium of claim 1 wherein said change of conjugation is accomplished by charge separation or recombination accompanied by increasing or decreasing molecular electronic state localization.

3. The switchable medium of claim 2 wherein said molecular system comprises

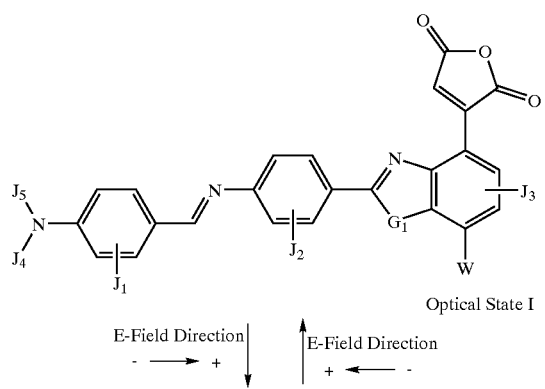

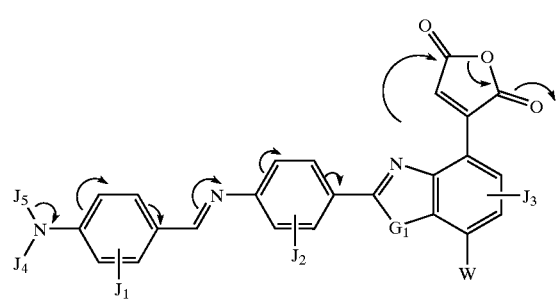

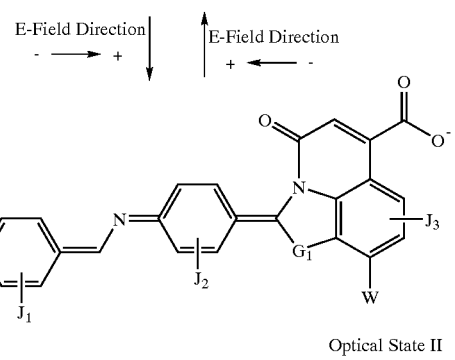

Optical State II where:

$J_1$, $J_2$, $J_3$, $J_4$, and $J_5$ are tuning groups to provide at least one appropriate functional effect selected from the group consisting of inductive effects, resonance effects, and steric effects, said tuning groups being selected from the group consisting of (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons;

$G_1$ is a ridging group to connect at least two conjugated rings to achieve a desired chromophore, said bridging group selected from the group consisting of (a) hetero atoms elected from the group consisting of N, O, S, and P, (b) functional groups with at least one of said hetero atoms, (c) saturated or unsaturated hydrocarbons, and (d) substituted hydrocarbons; and W is an electron-withdrawing group for tuning reactivity of the maleic anhydride group of said molecular system, which enables said molecular system to undergo a smooth charge separation or recombination upon application of said electric field, said electron-withdrawing group selected from the group consisting of (a) carboxylic acid and its derivatives, (b) nitro, (c) nitrile, (d) ketone, (e) aldehyde, (f) sulfone, (g) sulfuric acid and its derivatives, (h) hetero atoms selected from the group consisting of F Cl, Br, N, 0, and S, and (i) functional groups with at least one of said hetero atoms.

4. The switchable medium of claim 2 wherein said molecular system comprises

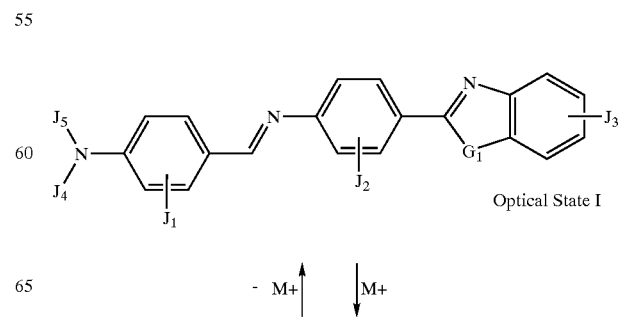

Optical State I

-continued

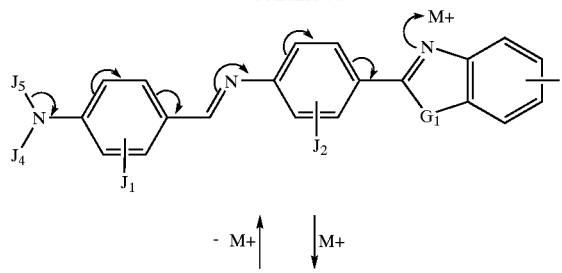

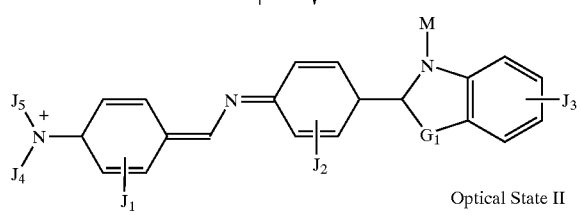

Optical State II where:

$J_1$, $J_2$, $J_3$, $J_4$ and $J_5$ are tuning groups to provide at least one appropriate functional effect selected from the group consisting of inductive effects, resonance effects, and steric effects, said tuning groups being selected from the group consisting of (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons;

$G_1$ is a ridging group to connect at least two conjugated rings to achieve a desired chromophore, said bridging group selected from the group consisting of (a) hetero atoms elected from the group consisting of N, O, S, and P, (b) functional groups with at least one of said hetero atoms, (c) saturated or unsaturated hydro-carbons, and (d) substituted hydrocarbons; and $M^+$ is selected from the group consisting of transition metals, their halogen complexes, $H^+$ and Lewis acids.

5. The switchable medium of claim 1 wherein said change of conjugation is accomplished by change of extent of the conjugation of the molecular electronic states via charge separation or recombination and π-bond breaking or making.

6. The switchable medium of claim 5 wherein said molecular system includes a C—O bond of a lactone that is labile enough and can undergo a bond breaking or making in the presence of an applied electric field, thereby inducing said change of the electron conjugation via chemical bonding change to change the band gap.

7. The switchable medium of claim 6 wherein said molecular system comprises

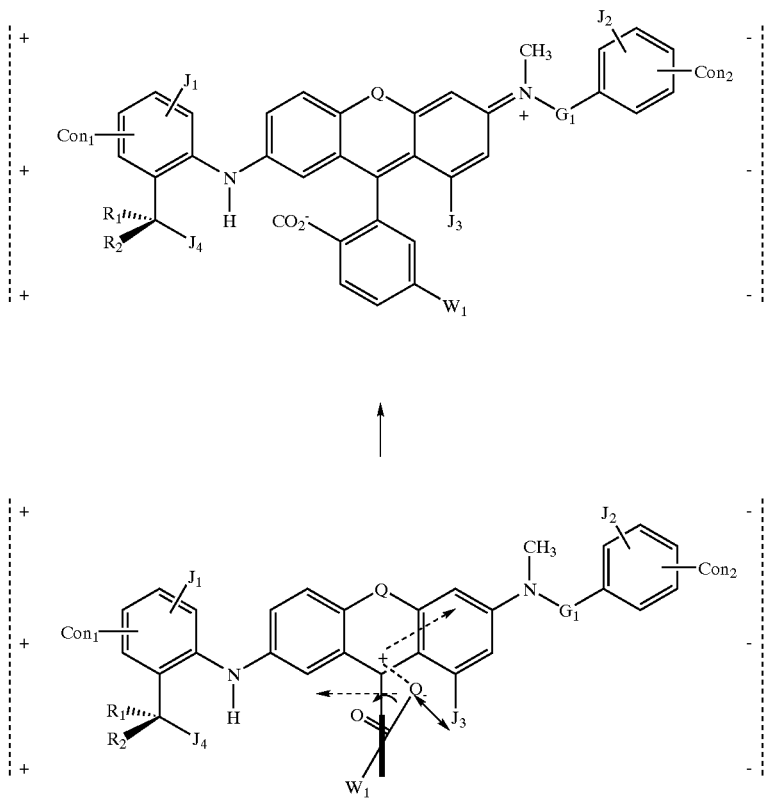

-continued

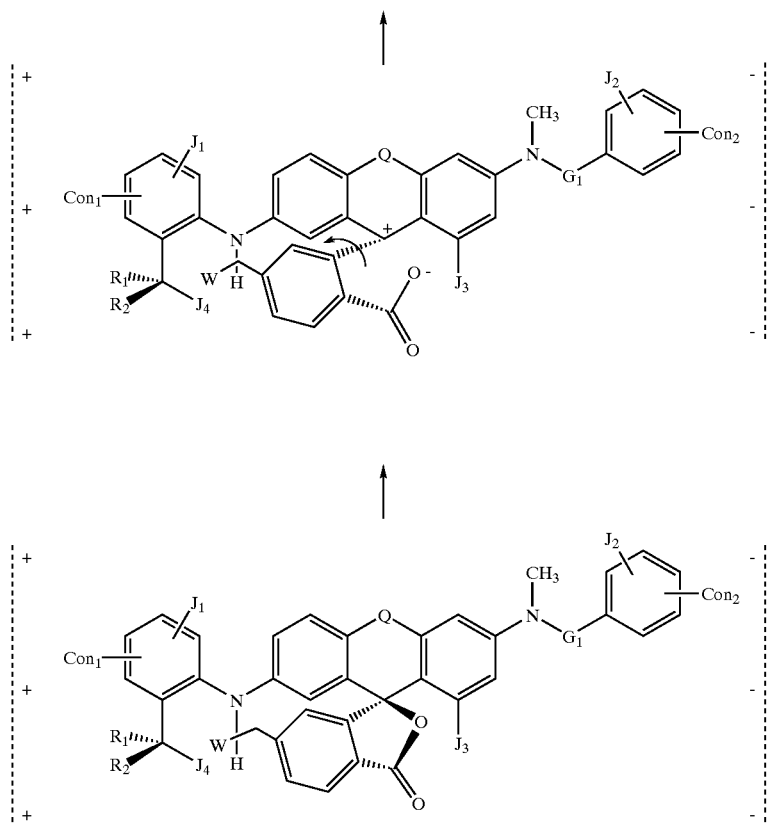

where:

Q is a connecting unit between two phenyl rings and is selected from the group consisting of S, O, NH, NR, hydrocarbon, or substituted hydrocarbon;

$Con_1$ and $Con_2$ are optional connecting units between one molecule and another molecule or between a molecule and a solid substrate, said connecting units independently elected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (e) substituted hydrocarbons;

$R_1$ and $R_2$ are spacing groups, used to provide an appropriate 3-dimensional scaffolding to allow molecules to pack together while providing rotational space for a part of the molecule, said spacing groups being independently selected from the group consisting of: (a) hydrogen, (b) saturated or unsaturated hydrocarbons, and (c) substituted hydrocarbons;

$J_1$, $J_2$, $J_3$, and $J_4$ are tuning groups to provide at least one appropriate functional effect selected from the group consisting of inductive effects, resonance effects, and steric effects, said tuning groups being selected from the group consisting of (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons;

$G_1$ is a ridging group to connect at least two conjugated rings to achieve a desired chromophore, said bridging group selected from the group consisting of (a) hetero atoms elected from the group consisting of N, O, S, and P, (b) functional groups with at least one of said hetero atoms, (c) saturated or unsaturated hydrocarbons, and (d) substituted hydrocarbons; and W is a electron-withdrawing group for tuning reactivity of the maleic anhydride group of said molecular system, which enables said molecular system to undergo a smooth charge separation or recombination upon application of said electric field, said electron-withdrawing group selected from the group consisting of (a) carboxylic acid and its derivatives, (b) nitro, (c) nitrile, (d) ketone, (e) aldehyde, (f) sulfone, (g) sulfuric acid and its derivatives, (h) hetero atoms selected from the group consisting of F Cl, Br, N, O, and S, and (i) functional groups with at least one of said hetero atoms.

8. The switchable medium of claim 6 wherein said molecular system comprises
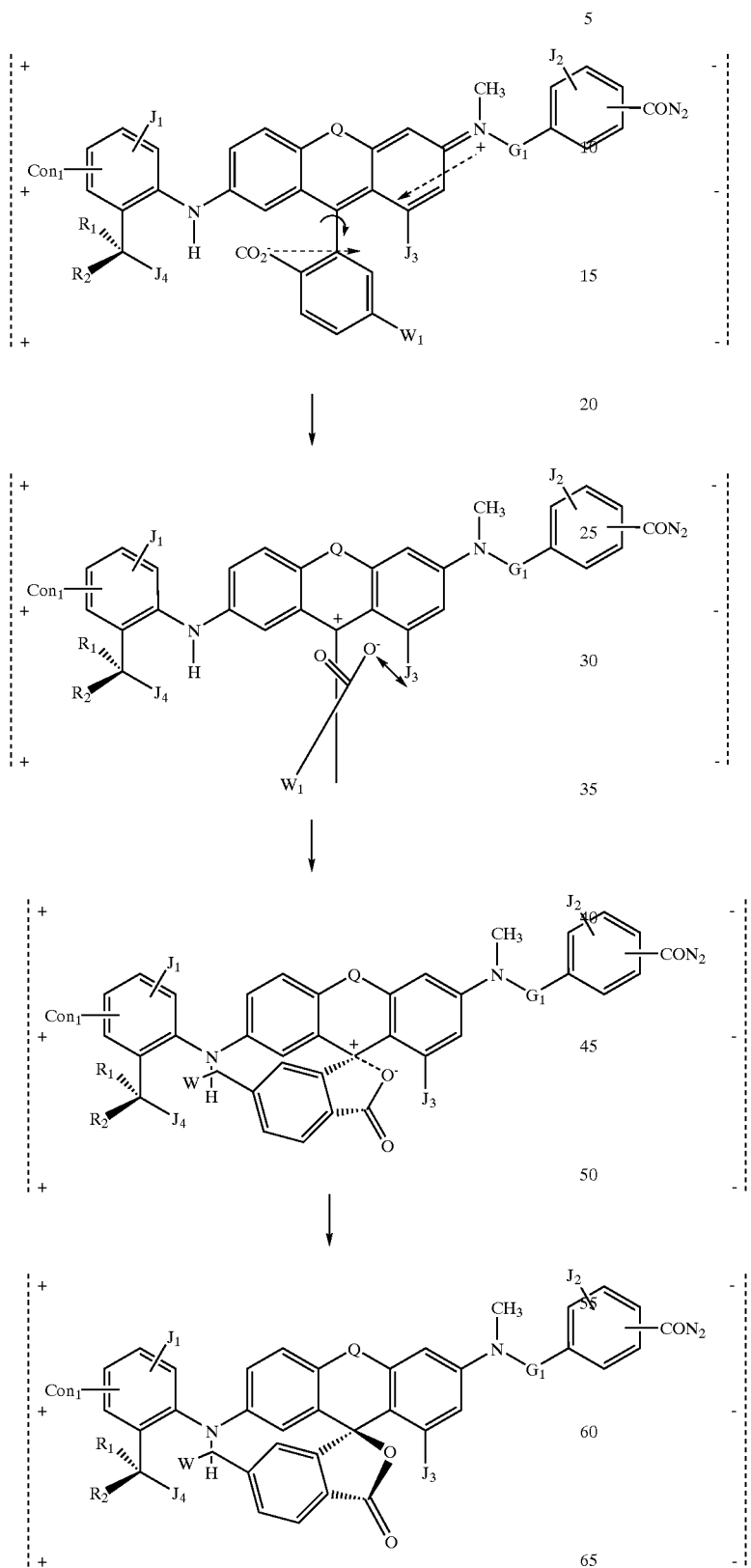

where:

Q is a connecting unit between two phenyl rings and is selected from the group consisting of S, O, NH, NR, hydrocarbon, or substituted hydrocarbon;

$Con_1$ and $Con_2$ are optional connecting units between one molecule and another molecule or between a molecule and a solid substrate, said connecting units independently elected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (e) substituted hydrocarbons;

$R_1$ and $R_2$ are spacing groups, used to provide an appropriate 3-dimensional scaffolding to allow molecules to pack together while providing rotational space for a part of the molecule, said spacing groups being independently selected from the group consisting of: (a) hydrogen, (b) saturated or unsaturated hydrocarbons, and (c) substituted hydrocarbons;

$J_1$, $J_2$, $J_3$ and $J_4$ are tuning groups to provide at least one appropriate functional effect selected from the group consisting of inductive effects, resonance effects, and steric effects, said tuning groups being selected from the group consisting of (a) hydrogen, (b) hetero atoms selected from the group consisting of N, O, S, P, B, F, Cl, Br a d I, (c) functional groups with at least one of said hetero atoms, (d) saturated or unsaturated hydrocarbons, and (e) substituted hydrocarbons;

$G_1$ is a bridging group to connect at least two conjugated rings to achieve a desired chromophore, said bridging group selected from the group consisting of (a) hetero atoms elected from the group consisting of N, O, S, and P, (b) functional groups with at least one of said hetero atoms, (c) saturated or unsaturated hydrocarbons, and (d) substituted hydrocarbons; and W is a electron-withdrawing group for tuning reactivity of the maleic anhydride group of said molecular system, which enables said molecular system to undergo a smooth charge separation or recombination upon application of said electric field, said electron-withdrawing group selected from the group consisting of (a) carboxylic acid and its derivatives, (b) nitro, (c) nitrile, (d) ketone, (e) aldehyde, (f) sulfone, (g) sulfuric acid and its derivatives, (h) hetero atoms selected from the group consisting of F Cl, Br, N, O, and S, and (i) functional groups with at least one of said hetero atoms.

9. The switchable medium of claim 6 wherein said molecular system comprises

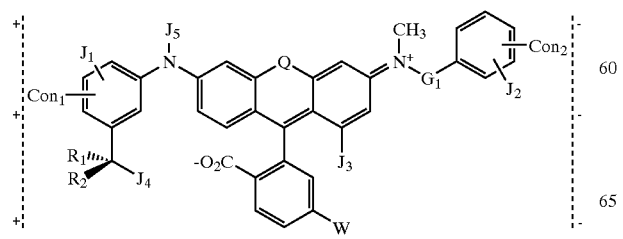

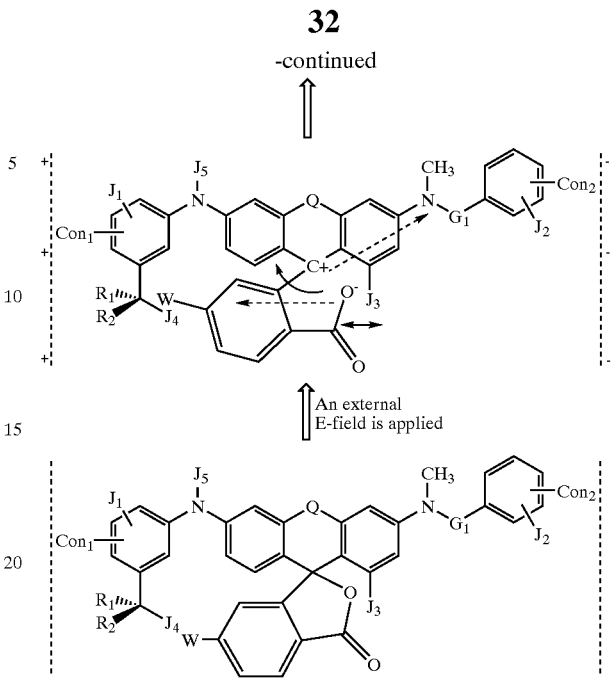

where:

Q is a connecting unit between two phenyl rings and is selected from the group consisting of S, O, NH, NR, hydrocarbon, or substituted hydrocarbon;

$Con_1$ and $Con_2$ are optional connecting units between one molecule and another molecule or between a molecule and a solid substrate, said connecting units independently elected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (e) substituted hydrocarbons;

$R_1$ and $R_2$ are spacing groups, used to provide an appropriate 3-dimensional scaffolding to allow molecules to pack together while providing rotational space for a part of the molecule, said spacing groups being independently selected from the group consisting of: (a) hydrogen, (b) saturated or unsaturated hydrocarbons, and (c) substituted hydrocarbons;

$J_1$, $J_2$, $J_3$, $J_4$, and $J_5$ are tuning groups to provide at least one appropriate functional effect selected from the group consisting of inductive effects, resonance effects, and steric effects, said tuning groups being selected from the group consisting of (a) hydrogen, (b) hetero atoms selected from the group consisting of N, O, S, P, B, F, Cl, Br and I, (c) functional groups with at least one of said hetero atoms, (d) saturated or u saturated hydrocarbons, and (e) substituted hydrocarbons;

$G_1$ is a ridging group to connect at least two conjugated rings to achieve a desired chromophore, said bridging group selected from the group consisting of (a) hetero atoms elected from the group consisting of N, O, S, and P, (b) functional groups with at least one of said hetero atoms, (c) saturated or unsaturated hydrocarbons, and (d) substituted hydrocarbons; and W is a electron-withdrawing group for tuning reactivity of the maleic anhydride group of said molecular system, which enables said molecular system to undergo a smooth charge separation or recombination upon application of said electric field, said electron-withdrawing group selected from the group consisting of (a) carboxylic acid and its derivatives, (b) nitro, (c) nitrile, (d) ketone, (e) aldehyde, (f) sulfone, (g) sulfuric acid and its derivatives, (h) hetero atoms selected from the group consisting of F, Cl, Br, N, O, and S, and (i) functional groups with at least one of said hetero atoms.

10. The switchable medium of claim 6 wherein said molecular system comprises

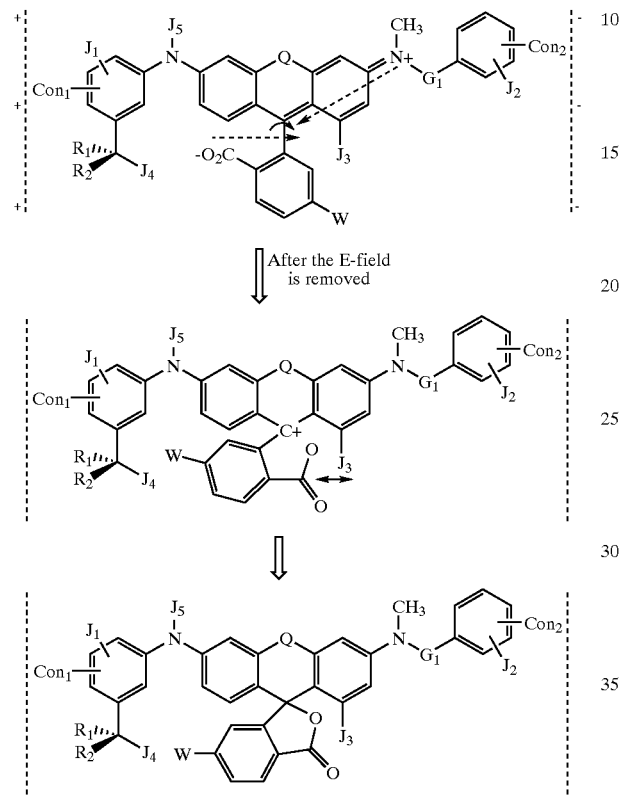

Q is a connecting unit between two phenyl rings and is selected from the group consisting of S, O, NH, NR, hydrocarbon, or substituted hydrocarbon;

$Con_1$ and $Con_2$ are optional connecting units between one molecule and another molecule or between a molecule and a solid substrate, said connecting units independently selected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (e) substituted hydrocarbons;

$R_1$ and $R_2$ are spacing groups, used to provide an appropriate 3-dimensional scaffolding to allow molecules to pack together while providing rotational space for a part of the molecule, said spacing groups being independently selected from the group consisting of: (a) hydrogen, (b) saturated or unsaturated hydrocarbons, and (c) substituted hydrocarbons;

$J_1$, $J_2$, $J_3$, $J_4$, and $J_5$ are tuning groups to provide at least one appropriate functional effect selected from the group consisting of inductive effects, resonance effects, and steric effects, said tuning groups being selected from the group consisting of (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons;

$G_1$ is a bridging group to connect at least two conjugated rings to achieve a desired chromophore, said bridging group selected from the group consisting of (a) hetero atoms elected from the group consisting of N, O, S, and P, (b) functional groups with at least one of said hetero atoms, (c) saturated or unsaturated hydrocarbons, and (d) substituted hydrocarbons; and W is a electron-withdrawing group for tuning reactivity of the maleic anhydride group of said molecular system, which enables said molecular system to undergo a smooth charge separation or recombination upon application of said electric field, said electron-withdrawing group selected from the group consisting of (a) carboxylic acid and its derivatives, (b) nitro, (c) nitrile, (d) ketone, (e) aldehyde, (f) sulfone, (g) sulfuric acid and its derivatives, (h) hetero atoms selected from the group consisting of F Cl, Br, N, O, and S, and (i) functional groups with at least one of said hetero atoms.

11. The switchable medium of claim 1 wherein said molecular system is bi-stable, which provides a non-volatile component.

12. The switchable medium of claim 1 wherein said molecular system has essentially an activation barrier between different states that is sufficiently low to provide a fast, but volatile, switch.

13. The switchable medium of claim 1 wherein said molecular system has more tha two switchable states, such that optical properties of said molecular system can be tuned by either continuously by application of a decreasing or increasing electric fiel to form a volatile switch or the color is changed abruptly by the application of voltage pulses to a switch with at least one activation barrier.

14. The switchable medium of claim 1 wherein said molecular system changes between a transparent state and a colored state.

15. The switchable medium of claim 1 wherein said molecular system changes between one colored state and another colored state.

16. An electronic ink including an electric field activated molecular system configured within an electric field generated by a pair of electrodes, said molecular system having an electric field induced band gap change that occurs via a reversible or irreversible change of extent of the electron conjugation in the molecule via emical bonding change to change the band gap, wherein in a first state, there is conjugation throughout the molecular system, resulting in a first band gap, and wherein in a second state, the conjugation is changed, resulting in a second band gap, wherein said second band gap is larger than said first band gap.

17. The electronic ink of claim 16 wherein said change of conjugation is accomplished by charge separation or recombination accompanied by increasing or decreasing molecular electronic state localization.

18. The electronic ink of 17 wherein said molecular system comprises

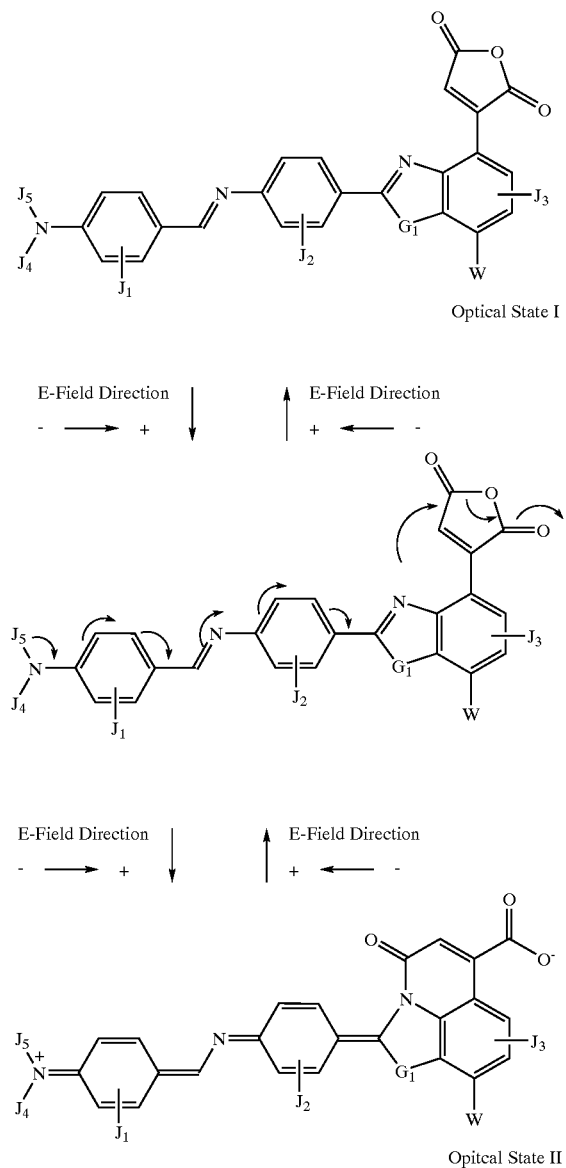

Optical State I

E-Field Direction
- ⟶ +   ↓

E-Field Direction
↑   + ⟵ -

Optical State II where:
- $J_1$, $J_2$, $J_3$, $J_4$ and $J_5$ are tuning groups to provide at least one appropriate functional effect selected from the group consisting of inductive effects, resonance effects, and steric effects, said tuning groups being selected from the group consisting of (a) hydrogen (b) hetero atoms selected from the group consisting of N, O, S, P, B, F, Cl, Br and I, (C) functional groups with at least one of said hetero atoms, (d) saturated or unsaturated hydrocarbons, and (e) substituted hydrocarbons;
- $G_1$ is a bridging group to connect at least two conjugated rings to achieve a desired chromophore, said bridging group selected from the group consisting of (a) hetero atoms elected from the group consisting of N, O, S, and P, (b) functional groups with a least one of said hetero atoms, (c) saturated or unsaturated hydrocarbons, and (d) substituted hydrocarbons; and
- W is a electron-withdrawing group for tuning reactivity of the maleic anhydride group fo said molecular system, which enables said molecular system to undergo a smooth charge separation or recombination upon application of said electric field, said electron-withdrawing group selected from the group consisting of (a) carboxylic acid and its derivatives, (b) nitro, (c) nitrile, (d) ketone, (e) aldehyde, (f) sulfone, (g) sulfuric acid and its derivatives, (h) hetero atoms selected from the group consisting of F, Cl, Br, N, O, and S, and (i) functional groups with at least one of said hetero atoms.

19. The electronic ink of claim 17 wherein said molecular system comprises

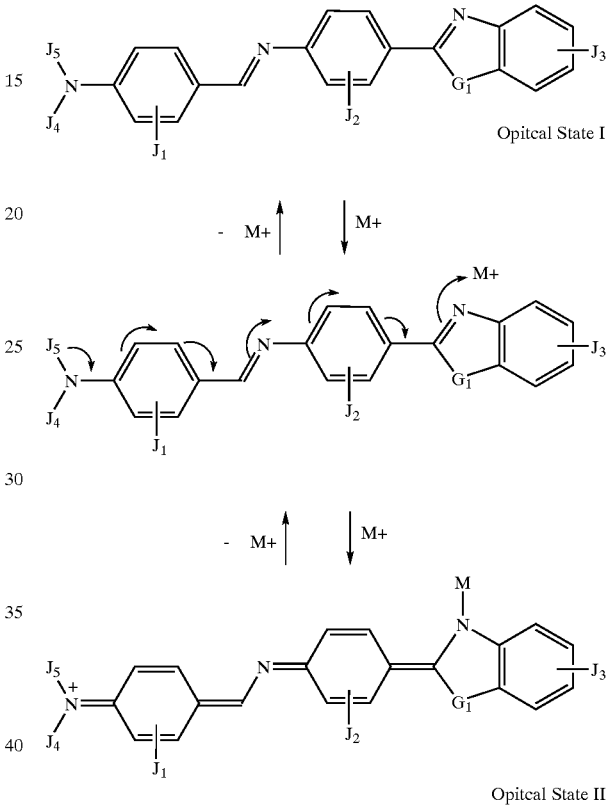

Optical State I

- $M+$ ↑   ↓ $M+$

Optical State II where:
- $J_1$, $J_2$, $J_3$, $J_4$ and $J_5$ are tuning groups to provide at least one appropriate functional effect selected from the group consisting of inductive effects, resonance effects, and steric effects, said tuning groups being selected from the group consisting of (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons;
- $G_1$ is a bridging group to connect at least two conjugated rings to achieve a desired chromophore, said bridging group selected from the group consisting of (a) hetero atoms elected from the group consisting of N, O, S, and P, (b) functional groups with a least one of said hetero atoms, (c) saturated or unsaturated hydrocarbons, and (d) substituted hydrocarbons; and
- $M^+$ is selected from the group consisting of transition metals, their halogen complexes, $H^+$, and Lewis acids.

20. The switchable medium of claim 16 wherein said change of conjugation is accomplished by change of extent of the conjugation of the molecular electronic states via charge separation or recombination and π-bond breaking or making.

21. The switchable medium of claim 20 wherein said molecular system includes C—O bond of a lactone that is labile enough and can undergo a bond breaking or making in the presence of an applied electric field, thereby inducing said change of the electron conjugation via chemical bonding change to change the band gap.

22. The switchable medium of claim 21 wherein said molecular system comprises

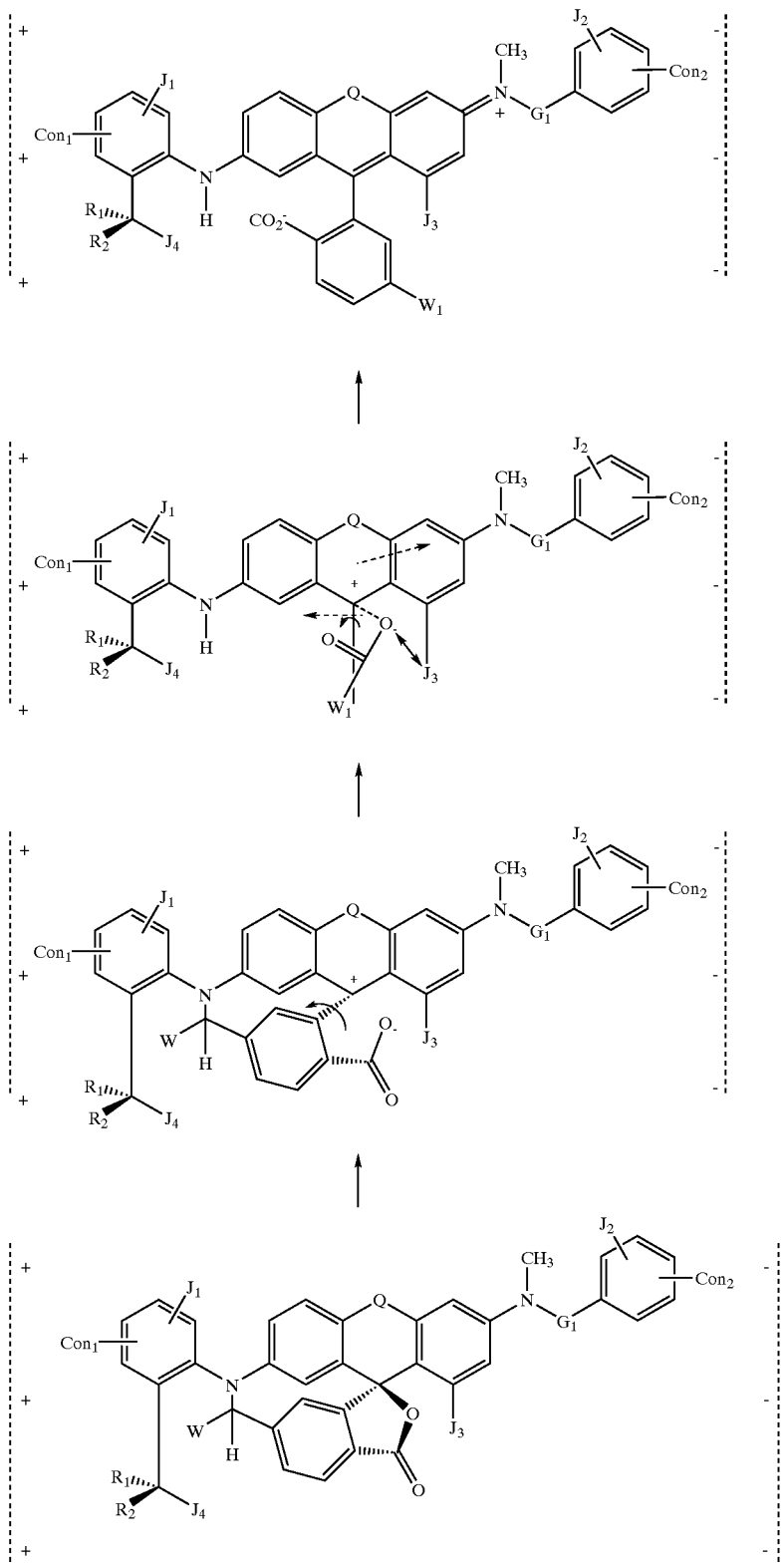

where:
- Q is a connecting unit between two phenyl rings and is selected from the group consisting of S, O, NH, NR, hydrocarbon, or substituted hydrocarbon;
- $Con_1$ and $Con_2$ are optional connecting units between one molecule and another molecule or between a molecule and a solid substrate, said connecting units independently elected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (e) substituted hydrocarbons;
- $R_1$ and $R_2$ are spacing groups, used to provide an appropriate 3-dimensional scaffolding to allow molecules to pack together while providing rotational space for a part of the molecule, said spacing groups being independently selected from the group consisting of: (a) hydrogen, (b) saturated or unsaturated hydrocarbons, and (c) substituted hydrocarbons;
- $J_1$, $J_2$, $J_3$, and $J_4$ are tuning groups to provide at least one appropriate functional effect selected from the group consisting of inductive effects, resonance effects, and steric effects, said tuning groups being selected from the group consisting of (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons;
- $G_1$ is a ridging group to connect at least two conjugated rings to achieve a desired chromophore, said bridging group selected from the group consisting of (a) hetero atoms elected from the group consisting of N, O, S, and P, (b) functional groups with at least one of said hetero atoms, (c) saturated or unsaturated hydrocarbons, and (d) substituted hydrocarbons; and
- W is a electron-withdrawing group for tuning reactivity of the maleic anhydride group of said molecular system, which enables said molecular system to undergo a smooth charge separation or recombination upon application of said electric field, said electron-withdrawing group selected from the group consisting of (a) carboxylic acid and its derivatives, (b) nitro, (c) nitrile, (d) ketone, (e) aldehyde, (f) sulfone, (g) sulfuric acid and its derivatives, (h) hetero atoms selected from the group consisting of F Cl, Br, N, O, and S, and (i) functional groups with at least one of said hetero atoms.

23. The electronic ink of claim 21 wherein said molecular system comprises

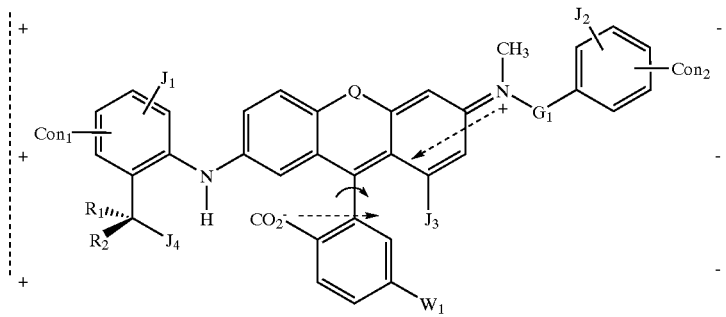

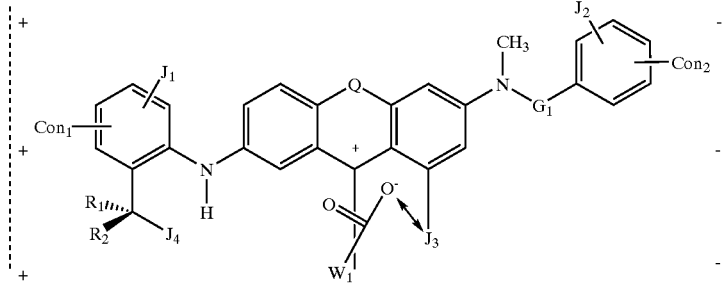

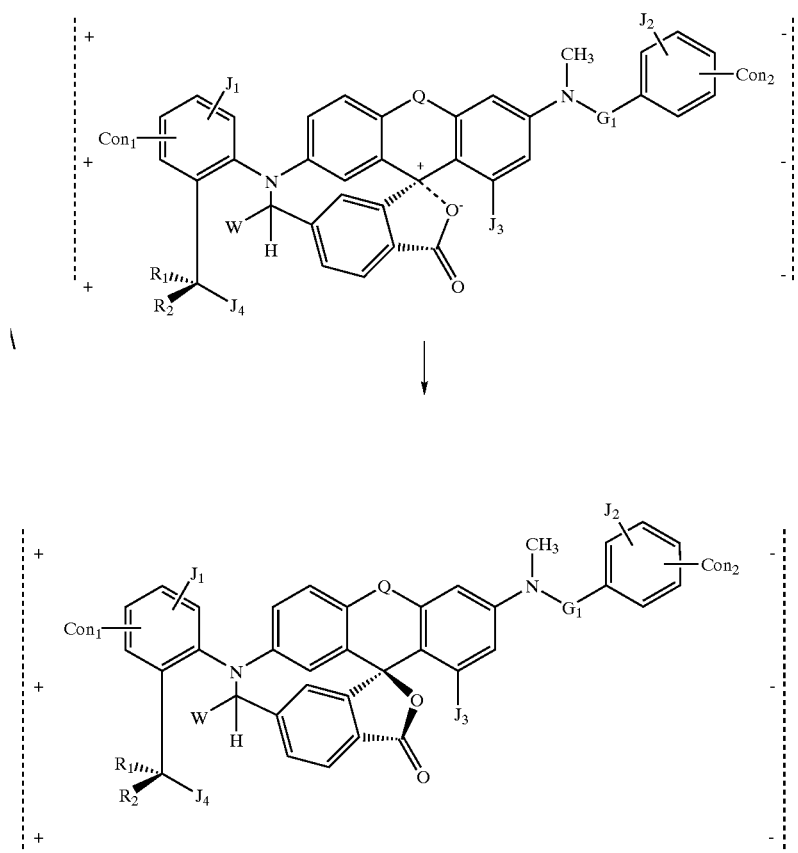

where:
- Q is a connecting unit between two phenyl rings and is selected from the group consisting of S, O, NH, NR, hydrocarbon, or substituted hydrocarbon;
- $Con_1$ and $Con_2$ are optional connecting units between one molecule and another molecule or between a molecule and a solid substrate, said connecting units independently selected from the group consisting of: (a) hydrogen (utilizing a hydrogen bond), (b multivalent hetero atoms selected from the group consisting of C, N, O, S, and P, (c) functional groups containing said hetero atoms, (d) saturated or unsaturated hydrocarbons, and (e) substituted hydrocarbons;
- $R_1$ and $R_2$ are spacing groups, used to provide an appropriate 3-dimensional scaffolding to allow molecules to pack together while providing rotational space for a part of the molecules, said spacing groups being independently selected from the group consisting of: (a) hydrogen, (b) saturated or unsaturated hydrocarbons, and (c) substituted hydrocarbons;
- $J_1$, $J_2$, $J_3$, and $J_4$ are tuning groups to provide at least one appropriate functional effect selected from the group consisting of inductive effects, resonance effects, and steric effects, said tuning groups being selected from the group consisting of (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons;
- $G_1$ is a bridging group to connect at least two conjugated rings to achieve a desired chromophore, said bridging group selected from the group consisting of (a) hetero atoms elected from the group consisting of N, O, S, and P, (b) functional groups with a least one of said hetero atoms, (c) saturated or unsaturated hydrocarbons, and (d) substituted hydrocarbons; and
- W is a electron-withdrawing group for tuning reactivity of the maleic anhydride group of said molecular system, which enables said molecular system to undergo a smooth charge separation or recombination upon application of said electric field, said electron-withdrawing group selected from the group consisting of (a) carboxylic acid and its derivatives, (b) nitro, (c) nitrile, (d) ketone, (e) aldehyde, (f) sulfone, (g) sulfuric acid and its derivatives, (h) hetero atoms selected from the group consisting of F Cl, Br, N, O, and S, and (i) functional groups with at least one of said hetero atoms.

24. The electronic ink of claim 21 wherein said molecular system comprises

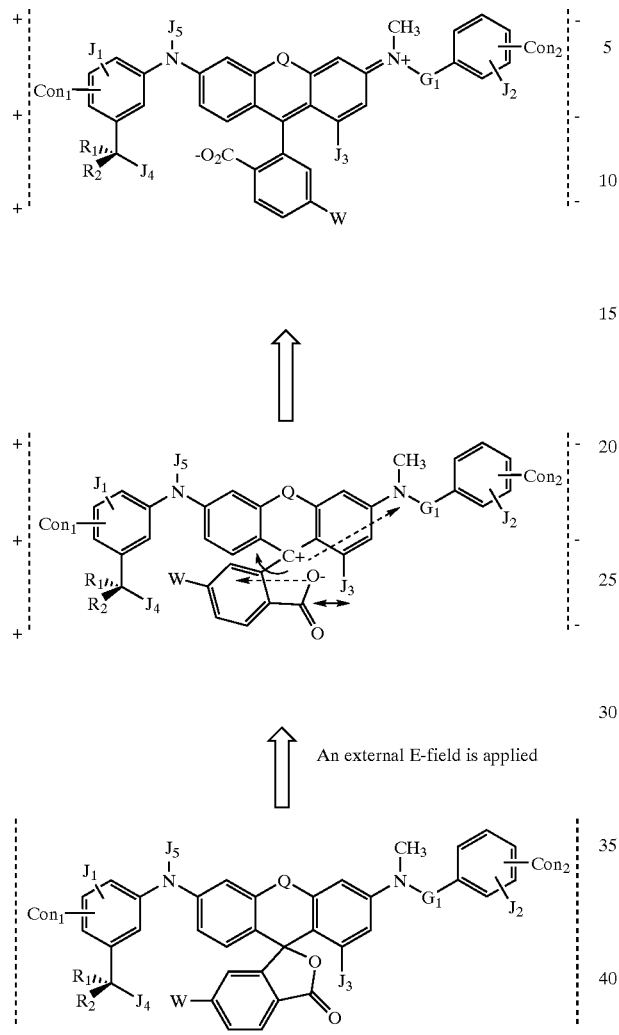

An external E-field is applied where:
- Q is connecting unit between two phenyl rings and is selected from the group consisting of S, O, NH, NR, hydrocarbon, or substituted hydrocarbon;
- $Con_1$ and $Con_2$ are optional connecting units between one molecule and another molecule or between a molecule and a solid substrate, said connecting units independently selected from the group consisting of: (a) hydrogen (utilizing a hydrogen bond), (b) multivalent hetero atoms selected from the group consisting of C, N, O, S, and P, c) functional groups containing said hetero atoms, (d) saturated or unsaturated hydrocarbons, and (e) substituted hydrocarbons;
- $R_1$ an $R_2$ are spacing groups, used to provide an appropriate 3-dimensional scaffolding to allow molecules to pack together while providing rotational space for a part of the molecule, said spacing groups being independently selected from the group consisting of: (a) hydrogen, (b) saturated or unsaturated hydrocarbons, and (c) substitute hydrocarbons;
- $J_1$, $J_2$, $J_3$, $J_4$, and $J_5$ are tuning groups to provide at least one appropriate functional effect selected from the group consisting of inductive effects, resonance effects, and steric effects, said tuning groups being selected from the group consisting of (a) hydrogen, (b) hetero atoms selected from the group consisting of N, O, S, P, B, F, Cl, B and I, (c) functional groups with at least one of said hetero atoms, (d) saturated or unsaturated hydrocarbons, and (e) substituted hydrocarbons;
- $G_1$ is bridging group to connect at least two conjugated rings to achieve a desired chromophore, said bridging group selected from the group consisting of (a) hetero atom selected from the group consisting of N, O, S, and P, (b) functional groups with at least one of said hetero atoms, (c) saturated or unsaturated hydrocarbons, and (d) substituted hydrocarbons; and
- W is an electron-withdrawing group for tuning reactivity of the maleic anhydride group of said molecular system, which enables said molecular system to undergo a smooth charge separation or recombination upon application of said electric field, said electron-withdrawing group selected from the group consisting of (a) carboxylic acid and its derivatives, (b) nitro, (c) nitrile, (d) ketone, (e) aldehyde, (f) sulfone, (g) sulfuric acid and its derivatives, (h) hetero atoms selected from the group consisting of F, Cl, Br, N, O, and S, and (i) functional groups with at least one of said hetero atoms.

25. The electronic ink of claim 21 wherein said molecular system comprises

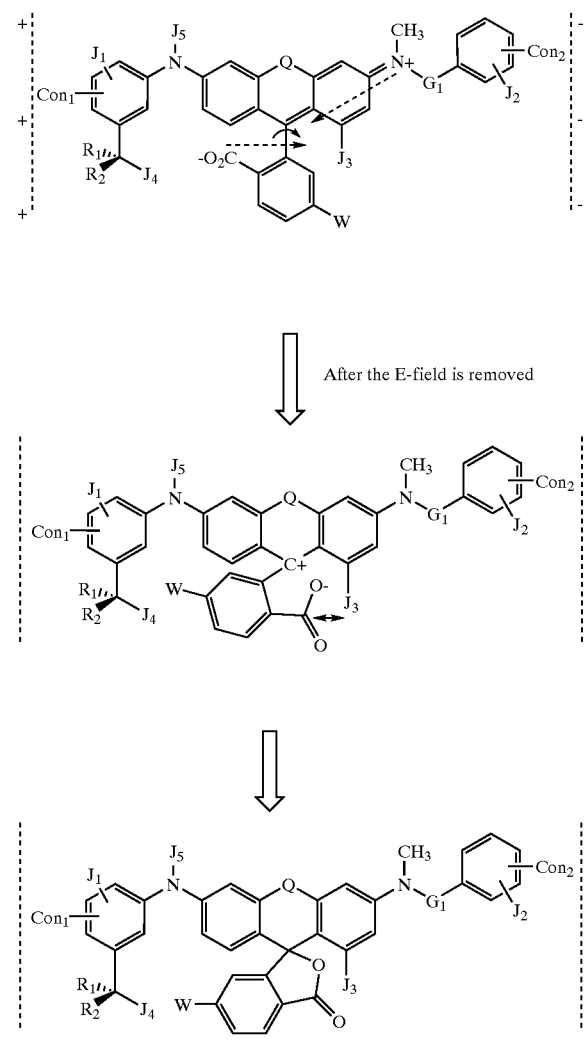

After the E-field is removed where:

Q is connecting unit between two phenyl rings and is selected from the group consisting of S, O, NH, NR, hydrocarbon, or substituted hydrocarbon;

$Con_1$ and $Con_2$ are optional connecting units between one molecule and another molecule or between a molecule and a solid substrate, said connecting units independently selected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (e) substituted hydrocarbons;

$R_1$ an $R_2$ are spacing groups, used to provide an appropriate 3-dimensional scaffolding to allow molecules to pack together while providing rotational space for a part of the molecule, said spacing groups being independently selected from the group consisting of: (a) hydrogen, (b) saturated or unsaturated hydrocarbons, and (c) substitute hydrocarbons;

$J_1$, $J_2$, $J_3$, $J_4$ and $J_5$ are tuning groups to provide at least one appropriate functional effect selected from the group consisting of inductive effects, resonance effects, and steric effects, said tuning groups being selected from the group consisting of (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons;

$G_1$ is bridging group to connect at least two conjugated rings to achieve a desired chromophore, said bridging group selected from the group consisting of (a) hetero atom selected from the group consisting of N, O, S, and P, (b) functional groups with at least one of said hetero atoms, (c) saturated or unsaturated hydro-carbons, and (d) substituted hydrocarbons; and W is an electron-withdrawing group for tuning reactivity of the maleic anhydride group of said molecular system, which enables said molecular system to undergo a smooth charge separation or recombination upon application of said electric field, said electron-withdrawing group selected from the group consisting of (a) carboxylic acid and its derivatives, (b) nitro, (c) nitrile, (d) ketone, (e) aldehyde, (f) sulfone, (g) sulfuric acid and its derivatives, (h) hetero atoms selected from the group consisting of F, Cl, Br, N, O, and S, and (i) functional groups with at least one of said hetero atoms.

26. The electronic ink of claim 16 wherein said molecular system is bi-stable, which provides a non-volatile component.

27. The electronic ink of claim 16 wherein said molecular system has esentially an activation barrier between different states that is sufficiently low to provide a fast, but volatile, switch.

28. The electronic ink of claim 16 wherein said molecular system has more than two switchable states, such that optical properties of said molecular system can be tuned by either continuously by application of a decreasing or increasing electric field to fo a volatile switch or the color is changed abruptly by the application of voltage pulses a a switch with at least one activation barrier.

29. The electronic ink of claim 16 wherein said molecular system changes between a transparent state and a colored state.

30. The electronic ink of claim 16 wherein said molecular system changes between one colored state and another colored state.

\* \* \* \* \*